US012376391B2

(12) United States Patent
Sato et al.

(10) Patent No.: US 12,376,391 B2
(45) Date of Patent: Jul. 29, 2025

(54) IMAGING DEVICE

(71) Applicant: Panasonic Intellectual Property Management Co., Ltd., Osaka (JP)

(72) Inventors: Yoshihiro Sato, Osaka (JP); Takayoshi Yamada, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 502 days.

(21) Appl. No.: 17/695,747

(22) Filed: Mar. 15, 2022

(65) Prior Publication Data

US 2022/0208811 A1    Jun. 30, 2022

Related U.S. Application Data

(63) Continuation of application No. PCT/JP2020/032973, filed on Sep. 1, 2020.

(30) Foreign Application Priority Data

Sep. 26, 2019   (JP) .................. 2019-175775

(51) Int. Cl.
*H10F 39/00* (2025.01)
*H04N 25/77* (2023.01)
(Continued)

(52) U.S. Cl.
CPC ........... *H10F 39/802* (2025.01); *H04N 25/77* (2023.01); *H04N 25/79* (2023.01); *H10F 39/18* (2025.01); *H10K 39/32* (2023.02)

(58) Field of Classification Search
CPC ..................... H01L 27/14603; H01L 27/14643
See application file for complete search history.

(56) References Cited

U.S. PATENT DOCUMENTS

2004/0097021 A1*   5/2004   Augusto ............... H10F 39/811
                                                            438/30
2013/0113060 A1   5/2013   Matsunaga
(Continued)

FOREIGN PATENT DOCUMENTS

JP   2012-019166   1/2012
JP   2016-127058   7/2016
(Continued)

OTHER PUBLICATIONS

International Search Report of PCT application No. PCT/JP2020/032973 dated Nov. 24, 2020.
(Continued)

*Primary Examiner* — Yara B Green
*Assistant Examiner* — Tessa Elizabeth McNamee
(74) *Attorney, Agent, or Firm* — Rimon P.C.

(57) ABSTRACT

An imaging device includes a pixel. The pixel includes a charge accumulator containing an impurity of a first conductivity type, a first transistor, a second transistor, a first well region containing an impurity of a second conductivity type, and a second well region containing an impurity of the first conductivity type. The charge accumulator accumulates charge generated through photoelectric conversion. The first transistor includes a first gate electrode and a first diffusion region containing an impurity of the first conductivity type. The second transistor includes a second gate electrode and a second diffusion region containing an impurity of the second conductivity type. The first transistor and the charge accumulator are located in the first well region, and the second transistor is located in the second well region. A distance between the charge accumulator and the second transistor is larger than a distance between the charge accumulator and the first transistor.

19 Claims, 21 Drawing Sheets

(51) Int. Cl.
   *H04N 25/79*   (2023.01)
   *H10F 39/18*   (2025.01)
   *H10K 39/32*   (2023.01)

(56) References Cited

U.S. PATENT DOCUMENTS

| | | |
|---|---|---|
| 2014/0043510 A1 | 2/2014 | Kasuga et al. |
| 2015/0109503 A1 | 4/2015 | Mori et al. |
| 2015/0123180 A1 | 5/2015 | Sato et al. |
| 2015/0145096 A1* | 5/2015 | Hsu ................. H10F 39/199 |
| | | 438/73 |
| 2016/0027825 A1* | 1/2016 | Moriyama ............ H04N 5/265 |
| | | 257/292 |
| 2016/0190187 A1 | 6/2016 | Nishimura et al. |
| 2019/0221594 A1 | 7/2019 | Sasago et al. |

FOREIGN PATENT DOCUMENTS

| | | | |
|---|---|---|---|
| JP | 2016-127593 | | 7/2016 |
| JP | 2016127058 A | * | 7/2016 |
| JP | 2019-125907 | | 7/2019 |
| WO | 2012/147302 | | 11/2012 |
| WO | 2014/002330 | | 1/2014 |
| WO | 2014/002361 | | 1/2014 |

OTHER PUBLICATIONS

Masahide Goto et al., "Pixel-Parallel 3-D Integrated CMOS Image Sensors With Pulse Frequency Modulation A/D Converters Developed by Direct Bonding of SOI Layers", IEEE Transactions on Electron Devices, vol. 62, No. 11, Nov. 2015, pp. 3530-3535.

* cited by examiner

IMAGING DEVICE

BACKGROUND

1. Technical Field

The present disclosure relates to an imaging device.

2. Description of the Related Art

Image sensors are used in digital cameras and the like. Examples of an image sensor include a charge-coupled device (CCD) image sensor and a complementary metal-oxide-semiconductor (CMOS) image sensor.

In an image sensor in an example, photodiodes are provided on a semiconductor substrate.

In an image sensor in another example, a photoelectric conversion layer is provided above a semiconductor substrate. An image sensor having such a structure is sometimes called a "multilayer imaging device".

In a multilayer imaging device in a specific example, signal charge is generated through photoelectric conversion. The generated charge is temporarily accumulated in a diffusion region provided on a semiconductor substrate. A signal according to the amount of charge accumulated is read through a CCD circuit or a CMOS circuit provided on the semiconductor substrate.

International Publication No. 2014/002330, International Publication No. 2012/147302, Japanese Patent No. 6323813, and M. Goto et al., "Pixel-Parallel 3-D Integrated CMOS Image Sensors with Pulse Frequency Modulation A/D Converters Developed by Direct Bonding of SOI Layers", IEEE Trans. on Electron Devices, 62, 11, p.3530 disclose imaging devices.

SUMMARY

In one general aspect, the techniques disclosed here feature an imaging device including at least one pixel. The at least one pixel includes a charge accumulator, a first transistor, a second transistor, a first well region, and a second well region. The charge accumulator accumulates charge generated through photoelectric conversion and contains an impurity of a first conductivity type. The first transistor includes a first gate electrode and a first diffusion region containing an impurity of the first conductivity type, the first gate electrode being electrically connected to the charge accumulator, the first diffusion region functioning as a source or a drain. The second transistor includes a second gate electrode and a second diffusion region containing an impurity of a second conductivity type different from the first conductivity type, the second diffusion region functioning as a source or a drain. The first well region contains an impurity of the second conductivity type. The second well region contains an impurity of the first conductivity type. In plan view, the first transistor and the charge accumulator are located in the first well region and the second transistor is located in the second well region. In plan view, a distance between the charge accumulator and the second transistor is larger than a distance between the charge accumulator and the first transistor.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Outline of Aspects of Present Disclosure

Figure 1:
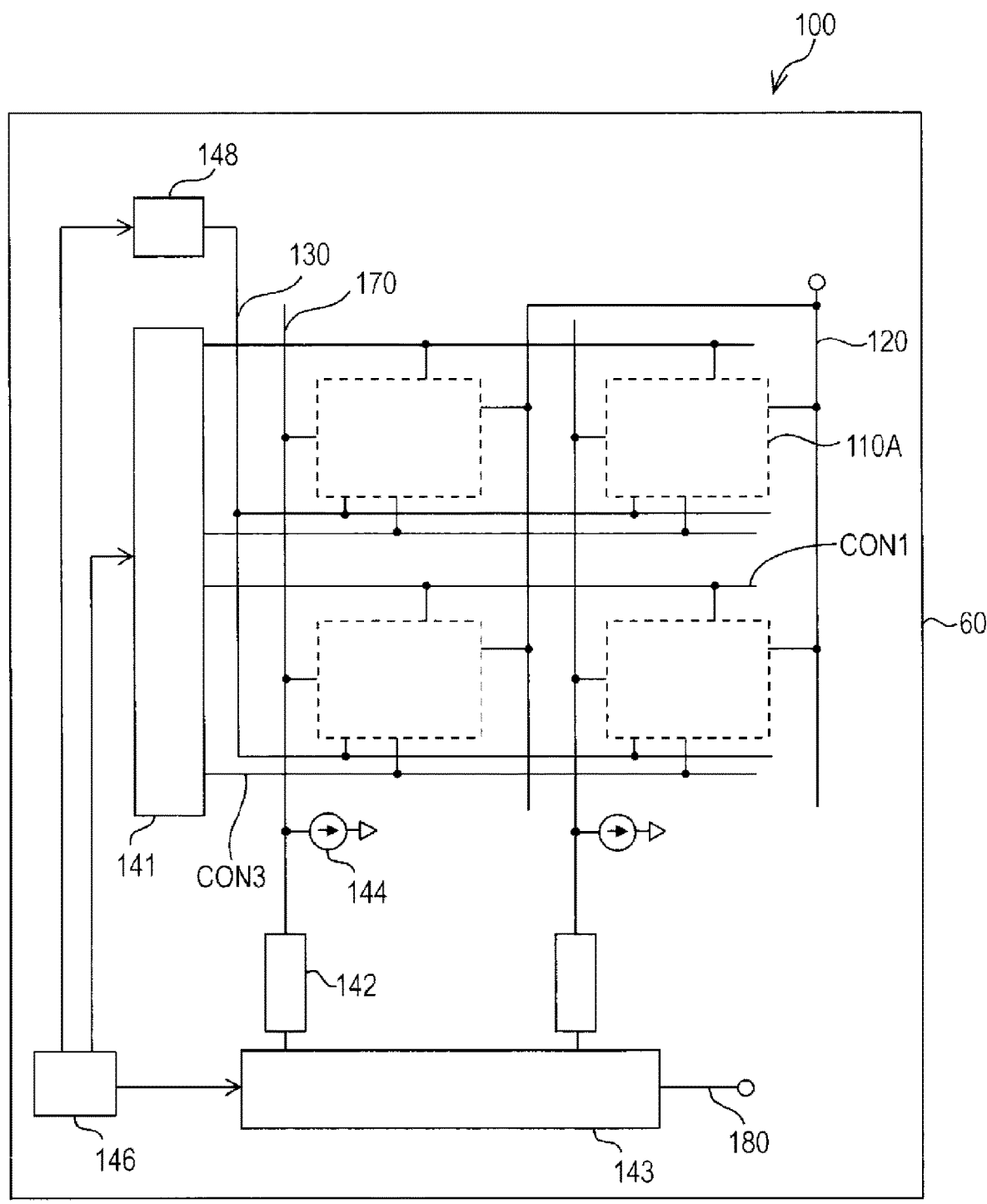
FIG. 1 is a schematic diagram illustrating an exemplary configuration of an imaging device according to a first embodiment.

An imaging device according to a first aspect of the present disclosure includes at least one pixel. The at least one pixel includes a charge accumulator that accumulates charge generated through photoelectric conversion and that contains an impurity of a first conductivity type, a first transistor that includes a first gate electrode and a first diffusion region containing an impurity of the first conductivity type, the first gate electrode being electrically connected to the charge accumulator, the first diffusion region functioning as a source or a drain, a second transistor that includes a second gate electrode and a second diffusion region containing an impurity of a second conductivity type different from the first conductivity type, the second diffusion region functioning as a source or a drain, a first well region that contains an impurity of the second conductivity type, and a second well region that contains an impurity of the first conductivity type. In plan view, the first transistor and the charge accumulator are located in the first well region and the second transistor is located in the second well region. In plan view, a distance between the charge accumulator and the second transistor is larger than a distance between the charge accumulator and the first transistor.

A technique according to the first aspect is suitable for obtaining a high-quality image.

A second aspect of the present disclosure is, for example, the imaging device according to the first aspect, in which the at least one pixel may further include an element isolation region that isolates the second transistor, and in which, in plan view, a distance between the charge accumulator and the element isolation region may be larger than the distance between the charge accumulator and the first transistor.

A technique according to the second aspect is suitable for obtaining a high-quality image.

A third aspect of the present disclosure is, for example, the imaging device according to the first or second aspect, in which the first transistor may be an amplifier transistor that generates a signal according to the charge accumulated in the charge accumulator.

The amplifier transistor is a specific example of the first transistor.

A fourth aspect of the present disclosure is, for example, the imaging device according to any of the first to third aspects, in which, in plan view, the first transistor may be located in a central region of the at least one pixel.

According to the fourth aspect, a relationship between the two distances according to the first aspect can be easily achieved.

A fifth aspect of the present disclosure is, for example, the imaging device according to any of the first to fourth aspects, in which, in plan view, the charge accumulator, the first transistor, and the second transistor may be arranged in a first direction in this order.

According to the fifth aspect, the relationship between the two distances according to the first aspect can be easily achieved.

A sixth aspect of the present disclosure is, for example, the imaging device according to any of the first to fifth aspects, in which the first conductivity type may be an n-type, and in which the second conductivity type may be a p-type.

The n-type is a specific example of the first conductivity type. The p-type is a specific example of the second conductivity type.

A seventh aspect of the present disclosure is, for example, the imaging device according to any of the first to sixth aspects, in which, in plan view, area of the first well region may be larger than area of the second well region.

A configuration according to the seventh aspect is a specific example of the configuration of the at least one pixel.

An eighth aspect of the present disclosure is, for example, the imaging device according to any of the first to seventh aspects, in which the at least one pixel may include pixels including a first pixel and a second pixel located adjacent to the first pixel, and in which, in plan view, the charge accumulator of the first pixel, the second transistor of the first pixel, the second transistor of the second pixel, and the charge accumulator of the second pixel may be arranged in a first direction in this order.

A technique according to the eighth aspect is suitable for obtaining a high-quality image.

A ninth aspect of the present disclosure is, for example, the imaging device according to the seventh aspect, in which the at least one pixel may include pixels including a first pixel and a second pixel located adjacent to the first pixel, and in which the first pixel and the second pixel may share the first well region.

The ninth aspect is advantageous in view of reducing the size of the imaging device.

A tenth aspect of the present disclosure is, for example, the imaging device according to any of the first to ninth aspects, in which the at least one pixel may further include a photoelectric conversion layer that converts light into the charge, and a pixel electrode that collects the charge generated in the photoelectric conversion layer, and in which the charge accumulator may accumulate the charge collected by the pixel electrode.

The tenth aspect is suitable for achieving a multilayer imaging device.

An eleventh aspect of the present disclosure is, for example, the imaging device according to the tenth aspect, in which the at least one pixel may further include a conductive structure that connects the pixel electrode and the charge accumulator to each other.

The eleventh aspect is suitable for transferring charge from a photoelectric conversion unit to the charge accumulator.

A twelfth aspect of the present disclosure is, for example, the imaging device according to any of the first to ninth aspects, in which the at least one pixel may further include a photodiode that converts light into the charge.

The photodiode is a specific example of the photoelectric conversion unit that converts light into charge.

In a thirteenth aspect of the present disclosure, for example, the imaging device according to any of the first to twelfth aspects may further include a semiconductor substrate, in which the first diffusion region of the first transistor and the second diffusion region of the second transistor may exist in a cross section perpendicular to a main surface of the semiconductor substrate.

A configuration according to the thirteenth aspect is a specific example of the configuration of the at least one pixel.

A fourteenth aspect of the present disclosure is, for example, the imaging device according to any of the first to thirteenth aspects, in which the first diffusion region of the first transistor may be different from the charge accumulator.

A fifteenth aspect of the present disclosure is, for example, the imaging device according to the first to fourteenth aspects, in which, in plan view, a distance between the charge accumulator and the second gate electrode of the second transistor may be larger than a distance between the charge accumulator and the first gate electrode of the first transistor.

An imaging device according to a sixteenth aspect of the present disclosure includes a pixel. The pixel includes a first transistor that includes a first diffusion region and a first gate electrode, the first diffusion region being a source or a drain, the first gate electrode containing an impurity of a first conductivity type, a second transistor that includes a second diffusion region and a second gate electrode, the second diffusion region being a source or a drain, the second gate electrode containing an impurity of a second conductivity type different from the first conductivity type, a first contact plug that is connected to the first diffusion region and that contains an impurity of the first conductivity type, a second contact plug that is connected to the second diffusion region and that contains an impurity of the second conductivity type, a first well region that contains an impurity of the second conductivity type, and a second well region that contains an impurity of the first conductivity type. In plan view, the first transistor is located in the first well region and the second transistor is located in the second well region.

A technique according to the sixteenth aspect is suitable for obtaining a high-quality image.

A seventeenth aspect of the present disclosure is, for example, the imaging device according to the sixteenth aspect, in which the first diffusion region may contain an impurity of the first conductivity type, and in which the second diffusion region may contain an impurity of the second conductivity type.

The first conductivity type is a specific example of a conductivity type of the impurity contained in the first diffusion region. The second conductivity type is a specific example of a conductivity type of the impurity contained in the second diffusion region.

An eighteenth aspect of the present disclosure is, for example, the imaging device according to the sixteenth or seventeenth aspect, in which the first diffusion region may be a charge accumulator that accumulates charge generated through photoelectric conversion, and in which the first transistor may be a reset transistor that resets potential of the first diffusion region.

The reset transistor is a specific example of the first transistor.

A nineteenth aspect of the present disclosure is, for example, the imaging device according to the sixteenth or seventeenth aspect, in which the first diffusion region may be a charge accumulator that accumulates charge generated through photoelectric conversion, and in which the first gate electrode may be electrically connected to the first diffusion region.

An imaging device according to a twentieth aspect of the present disclosure includes a pixel, in which the pixel includes a first transistor that includes a source or a drain which contains an impurity of a first conductivity type, and a second transistor that includes a source or a drain which contains an impurity of a second conductivity type different from the first conductivity type.

The pixel according to the twentieth aspect includes transistors whose polarities are opposite to each other. The twentieth aspect is suitable for achieving a small, high-performance imaging device. An example of the first transistor in the twentieth aspect is an amplifier transistor. Another example is a reset transistor.

An imaging device according to a twenty-first aspect of the present disclosure includes a pixel, in which the pixel includes a first transistor that includes a first diffusion region, which is a source or a drain, and a first gate electrode which contains an impurity of a first conductivity type, a first plug that is connected to the first diffusion region and that contains an impurity of the first conductivity type.

A technique according to the twenty-first aspect is suitable for obtaining a high-quality image. An example of the first transistor in the twenty-first aspect is a reset transistor.

Ordinal numbers such as "first", "second", "third", and the like will be used herein. When an ordinal number is given to an element, another element with a smaller ordinal number need not necessarily exist. Ordinal numbers may be changed as necessary.

Embodiments that will be described hereinafter are general or specific examples. Values, shapes, materials, elements, arrangement and connection modes of the elements, steps, order of the steps, and the like mentioned in the following embodiments are examples, and do not limit the present disclosure. Various aspects described herein may be combined together insofar as no contradiction is caused. In the following description, elements having essentially the same functions will be given the same reference numerals, and description thereof is omitted. Illustration of some elements is omitted in order to keep drawings from becoming excessively complex.

The drawings only schematically illustrate various elements in order to facilitate understanding of the present disclosure, and dimensional ratios and appearances might be different from reality. That is, the drawings are schematic drawings and are not necessarily strict illustrations. Scales and the like, for example, do not necessarily match between the drawings.

It should be noted that general or specific aspects may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Polarities of transistors and conductivity types of diffusion regions in the following embodiments are examples. The polarities of the transistors and the conductivity types of the diffusion regions may be reversed insofar as no contradiction is caused.

First Embodiment

An imaging device 100 according to a first embodiment will be described hereinafter. The imaging device 100 includes a reading circuit 50A including transistors.

Structure of Imaging Device 100

FIG. 1 illustrates the circuit configuration of the imaging device 100. The imaging device 100 includes pixels 110A and peripheral circuits. The pixels 110A and the peripheral circuits are provided on a semiconductor substrate 60.

In the present embodiment, the pixels 110A and the peripheral circuits are provided on a single semiconductor substrate 60. The pixels 110A and the peripheral circuits, however, may be provided on different semiconductor substrates, instead.

In the imaging device 100, the pixels 110A are arranged in two dimensions to form a pixel array.

In the present embodiment, the pixels 110A are arranged in a row direction and a column direction. The row direction and the column direction refer to directions in which rows and columns extend, respectively. In FIG. 1, a vertical direction, that is, an up-and-down direction, is the column direction. A horizontal direction, that is, a left-and-right direction, is the row direction. More specifically, the center of each of the pixels 110A is located at one of grid points of a square grid.

The pixels 110A may be arranged in another mode. For example, the center of each of the pixels 110A may be located at one of grid points of a triangular grid, a hexagonal grid, or the like, instead.

The pixels 110A may be arranged in one dimension, instead. In this case, the imaging device 100 may be a line sensor.

The number of pixels 110A included in the imaging device 100 may be one, instead.

Each of the pixels 110A is connected to a power supply line 120. A predetermined power supply voltage is supplied to each of the pixels 110A through the power supply line 120.

The imaging device 100 includes photoelectric conversion units 17. The photoelectric conversion units 17 perform photoelectric conversion on incident light. As a result, charge is generated. In a typical example, the pixels 110A each include a photoelectric conversion unit 17.

In the present embodiment, the photoelectric conversion units 17 each have a film-like shape. The photoelectric conversion units 17 are stacked on the semiconductor substrate 60. That is, the imaging device 100 is a multilayer imaging device.

In the present embodiment, the photoelectric conversion units 17 of the pixels 110A are continuously arranged on the semiconductor substrate 60 without gaps provided therebetween. The same voltage is supplied to all the continuously arranged photoelectric conversion units 17.

In another example, the photoelectric conversion units 17 of the pixels 110A are arranged on the semiconductor substrate 60 with gaps provided therebetween. Different voltages can be supplied to the photoelectric conversion units 17.

The peripheral circuits include a control circuit 146, a voltage supply circuit 148, a vertical scanning circuit 141, column signal processing circuits 142, a horizontal signal reading circuit 143, and constant current sources 144. The peripheral circuits may also include other signal processing circuits, output circuits, and the like.

The voltage supply circuit 148 supplies a voltage to the pixels 110A through an accumulation control line 130. More specifically, the voltage supply circuit 148 supplies a voltage to the photoelectric conversion units 17 through the accumulation control line 130.

The voltage supply circuit 148 may be a circuit that converts a voltage supplied from a power supply such as a battery into a predetermined voltage. The voltage supply circuit 148 may be a circuit that generates a predetermined voltage, instead. The voltage supply circuit 148 may be a part of the vertical scanning circuit 141.

In the present embodiment, the column signal processing circuits 142 are provided in one-to-one correspondence with the columns of the pixel array of the pixels 110A. The constant current sources 144 are provided in one-to-one correspondence with the columns of the pixel array of the pixels 110A.

The vertical scanning circuit 141 is connected to band control signal lines CON1 and selection control signal lines CON3.

The vertical scanning circuit 141 applies a predetermined voltage to the band control signal lines CON1. As a result, feedback of signal charge is adjusted.

The vertical scanning circuit 141 applies a predetermined voltage to the selection control signal lines CON3. As a result, rows of the pixel array are selected, and the pixels 110A in the rows are selected. In the present embodiment, the pixels 110A are thus selected in units of rows. Signal voltages are then read from the selected pixels 110A and pixel electrodes are reset.

The column signal processing circuits 142 can also be called "row signal accumulation circuits". The vertical scanning circuit 141 can also be called a "row scanning circuit". The selection control signal lines CON3 can also be called "address signal lines".

The control circuit 146 controls the entirety of the imaging device 100. In order to control the entirety of the imaging device 100, the control circuit 146 receives command data, a clock signal, and the like. These are given, for example, from the outside of the imaging device 100.

The control circuit 146 typically includes a timing generator. The control circuit 146 supplies driving signals to the vertical scanning circuit 141, the horizontal signal reading circuit 143, the voltage supply circuit 148, and the like. In FIG. 1, an arrow extending from the control circuit 146 schematically indicates the flow of an output signal from the control circuit 146.

The control circuit 146 can be achieved, for example, by a microcontroller including one or more processors. The function of the control circuit 146 may be achieved by a combination of a general-purpose processing circuit and software. The function of the control circuit 146 may be achieved by hardware dedicated to such processing, instead.

The pixels 110A arranged in each column is electrically connected to one of the column signal processing circuits 142 through a vertical signal line 170 corresponding to the column. The column signal processing circuits 142 perform noise suppression signal processing, analog-to-digital (A/D)

conversion, and the like. The noise suppression signal processing is, for example, correlated double sampling.

The column signal processing circuits 142 is connected to the horizontal signal reading circuit 143. The horizontal signal reading circuit 143 reads signals from the column signal processing circuits 142 and outputs the signals to a horizontal common signal line 180.

Next, the structure of each of the pixels 110A according to the present embodiment will be described with reference to FIGS. 2 to 4.

Figure 2:
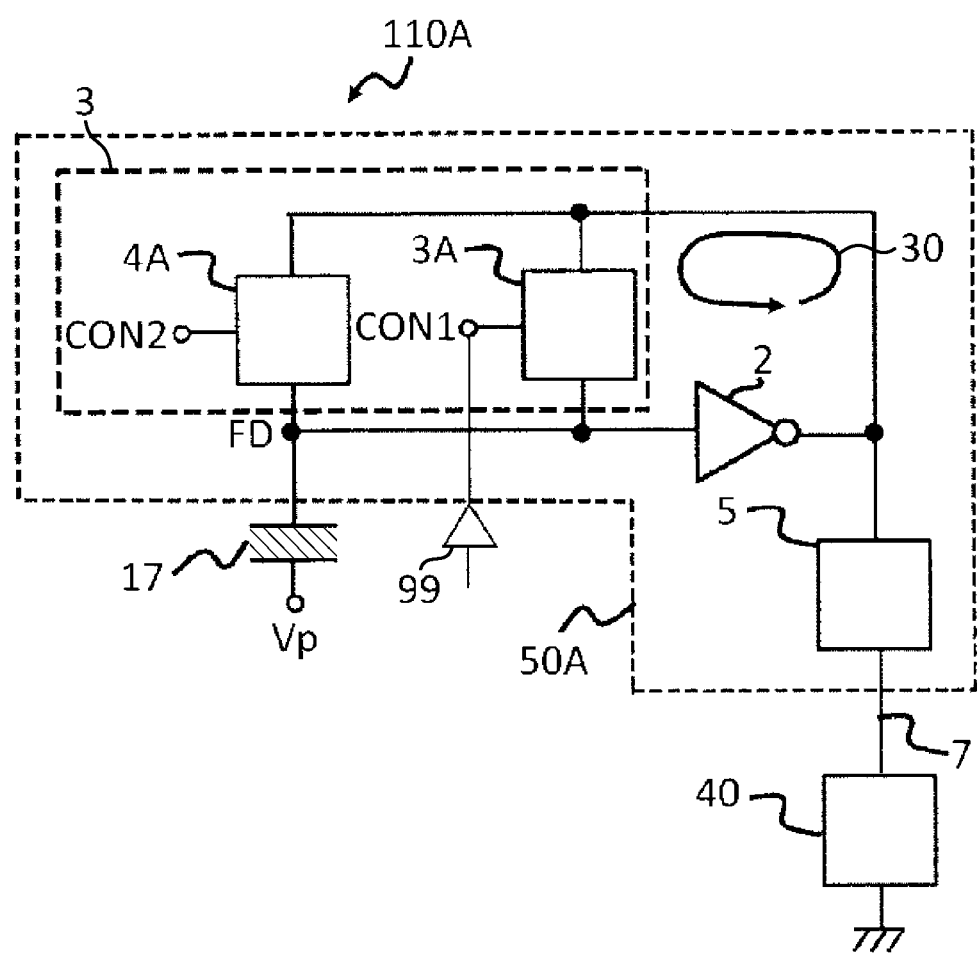
FIG. 2 is a schematic diagram illustrating an exemplary circuit configuration of a pixel in the imaging device according to the first embodiment.

FIG. 2 illustrates the circuit configuration of the pixel 110A. The pixel 110A includes the photoelectric conversion unit 17 and the reading circuit 50A.

The photoelectric conversion unit 17 receives incident light and generates signal charge. Signal charge will also be simply referred to as "charge" hereinafter.

More specifically, the photoelectric conversion unit 17 receives incident light and generates positive and negative charges. In the present embodiment, positive charge is used as signal charge. The positive and negative charges are typically hole-electron pairs.

The reading circuit 50A reads signal charge generated by the photoelectric conversion unit 17. The reading circuit 50A includes an amplifier 2, a band control unit 3, a charge accumulation unit FD, and an output selection unit 5.

The charge accumulation unit FD accumulates signal charge generated by the photoelectric conversion unit 17. The charge accumulation unit FD is a diffusion region provided in the semiconductor substrate 60.

An input of the amplifier 2 is connected to the charge accumulation unit FD. The amplifier 2 amplifies a signal according to signal charge accumulated in the charge accumulation unit FD and outputs the amplified signal to the band control unit 3 and the output selection unit 5.

The band control unit 3 includes a band control circuit 3A and a reset circuit 4A.

A voltage control circuit 99 supplies at least three different voltages to the band control circuit 3A. The band control circuit 3A achieves a band control function according to the supplied voltages. The band control circuit 3A gives band limitation to an output signal of the amplifier 2 and outputs the signal to the charge accumulation unit FD.

The reset circuit 4A resets the charge accumulation unit FD. More specifically, the reset circuit 4A resets signal charge accumulated in the charge accumulation unit FD.

In the imaging device 100, a feedback circuit 30, which is a feedback loop that passes through the amplifier 2, the band control unit 3, and the charge accumulation unit FD, is formed.

In the feedback circuit 30, a signal read from the charge accumulation unit FD is amplified by the amplifier 2, given band limitation by the band control circuit 3A, and fed back to the charge accumulation unit FD.

The output selection unit 5 is connected to a signal reading line 7. The signal reading line 7 corresponds to one of the vertical signal lines 170 illustrated in FIG. 1. The signal reading line 7 is shared between at least two pixels 110A.

The output selection unit 5 has a function of outputting a signal amplified by the amplifier 2 to the signal reading line 7. The output selection unit 5 also has a function of supplying a current to the amplifier 2. These functions can be switched.

Figure 3A:
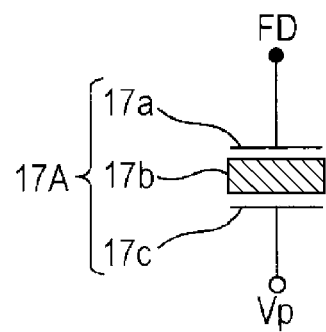
FIG. 3A is a schematic diagram illustrating an example of a photoelectric conversion unit.
Figure 3B:
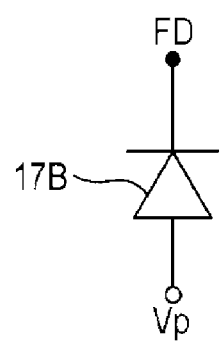
FIG. 3B is a schematic diagram illustrating another example of the photoelectric conversion unit.

FIG. 3A illustrates a photoelectric conversion unit 17A, which is a specific example of the photoelectric conversion unit 17 according to the present embodiment. FIG. 3B illustrates a photoelectric conversion unit 17B, which is another specific example of the photoelectric conversion unit 17.

The photoelectric conversion unit 17A illustrated in FIG. 3A includes a photoelectric conversion layer 17b, a counter electrode 17c, and a pixel electrode 17a. The photoelectric conversion layer 17b is sandwiched by the counter electrode 17c and the pixel electrode 17a. The photoelectric conversion unit 17A is stacked on the semiconductor substrate 60.

The photoelectric conversion layer 17b is composed of an organic material or an inorganic material such as amorphous silicon. The photoelectric conversion layer 17b may include a layer composed of an organic material and a layer composed of an inorganic material, instead. The photoelectric conversion layer 17b has a film-like shape. The photoelectric conversion layer 17b is typically continuously provided across the pixels 110A.

The pixel electrode 17a is composed of, for example, conductive polysilicon doped with a metal such as aluminum or copper, a metal nitride, or an impurity. The pixel electrode 17a is spatially separated from other pixel electrodes 17a in adjacent pixels 110A. As a result, the pixel electrode 17a is electrically isolated from the other pixel electrodes 17a in the other pixels 110A.

The counter electrode 17c is composed of a transparent conductive material such as indium tin oxide (ITO). The counter electrode 17c, therefore, has translucency. "Translucency" refers to a property of passing of at least a part of light having wavelengths that can be absorbed by the photoelectric conversion layer 17b and need not pass light over the entirety of a wavelength range of visible light. As with the photoelectric conversion layer 17b, the counter electrode 17c is typically continuously provided across the pixels 110A.

A reference voltage Vp is applied to the counter electrode 17c. The pixel electrode 17a is connected to the charge accumulation unit FD. The photoelectric conversion layer 17b converts light into charge. The pixel electrode 17a collects charge generated by the photoelectric conversion layer 17b. The charge accumulation unit FD accumulates charge collected by the pixel electrode 17a.

More specifically, the pixel 110A has a conductive structure in which the pixel electrode 17a and the charge accumulation unit FD are connected to each other. The conductive structure can include a wiring layer, a plug, and the like. FIG. 3A does not illustrate the conductive structure.

The photoelectric conversion layer 17b illustrated in FIG. 3B is a photodiode. More specifically, the photoelectric conversion unit 17B is provided on the semiconductor substrate 60.

The reference voltage Vp is applied to an end of the photodiode, which is the photoelectric conversion unit 17B. When positive charge is read as signal charge, the reference voltage Vp is typically a positive reference voltage. The charge accumulation unit FD is connected to another end of the photodiode. The photodiode generates charge. The charge accumulation unit FD accumulates charge generated by the photodiode.

The photoelectric conversion unit 17 may be an element having another photoelectric conversion function.

The pixel 110A and the reading circuit 50A will be further described with reference to FIG. 4.

The reading circuit 50A includes an amplifier transistor 200, a feedback transistor 301, a reset transistor 400, and a selection transistor 502. The amplifier transistor 200, the feedback transistor 301, and the reset transistor 400 are n-type metal-oxide-semiconductor field-effect transistors (MOSFETs). The selection transistor 502 is a p-type MOSFET.

An n-type MOSFET will also be referred to as an "NMOS" hereinafter. A p-type MOSFET will also be referred to as a "PMOS" hereinafter.

In the present embodiment, whether each of two diffusion regions of a MOSFET is a source or a drain is determined on the basis of a polarity of the MOSFET and a potential at the time. Whether each of two diffusion regions of an MOSFET is a source or a drain, therefore, can vary depending on an operation state of the MOSFET.

An imaging device, however, can be configured such that two diffusion regions of an MOSFET are fixed as a source and a drain, respectively. Alternatively, sources and drains may switch in some MOSFETs, and sources and drains may be fixed in other MOSFETs.

The amplifier 2 includes the amplifier transistor 200 and a switching circuit 20. The amplifier transistor 200 and the switching circuit 20 are connected to each other.

A gate of the amplifier transistor 200 is connected to the charge accumulation unit FD.

Either a source or a drain of the amplifier transistor 200 is connected to either a source or a drain of the feedback transistor 301. The source or the drain of the amplifier transistor 200 is also connected to either a source or a drain of the selection transistor 502.

The switching circuit 20 includes a first switch element 11 and a second switch element 12. The switching circuit 20 is connected to another of the source and the drain of the amplifier transistor 200.

More specifically, the other of the source and the drain of the amplifier transistor 200 can be connected to a first voltage source VA1 through the first switch element 11. The other of the source and the drain of the amplifier transistor 200 can also be connected to a second voltage source VA2 through the second switch element 12. By controlling the switching circuit 20 using control signals V1 and V2, a voltage applied to the other of the source and the drain of the amplifier transistor 200 can switch between voltages Va1 and Va2.

The voltage Va1 of the first voltage source VA1 is, for example, a ground voltage GND. The voltage Va2 of the second voltage source VA2 is, for example, a power supply voltage VDD.

The switching circuit 20 may be provided for each pixel 110A. Alternatively, the switching circuit 20 may be shared by some pixels 110A. Sharing of the switching circuit 20 is advantageous in view of reducing the number of elements used for each pixel.

The band control circuit 3A includes the feedback transistor 301, a first capacitor 9, and a second capacitor 10.

A "capacitor" refers to a structure in which a dielectric such as an insulating film is sandwiched between electrodes. An "electrode" is not limited to one composed of a metal but interpreted as broadly including polysilicon layers and the like. An electrode may be a part of the semiconductor substrate 60.

The first capacitor 9 and the second capacitor 10 may be metal-insulator-metal (MIM) capacitors. The first capacitor 9 and the second capacitor 10 may be metal-insulator-semiconductor (MIS) capacitors.

Either the source or the drain of the feedback transistor 301 is connected to either the source or the drain of the amplifier transistor 200. Either the source or the drain of the feedback transistor 301 is also connected to either the source or the drain of the selection transistor 502.

Another of the source and the drain of the feedback transistor 301 is connected to an end of the first capacitor 9. A reference voltage VR1 is applied to another end of the first capacitor 9. The feedback transistor 301 and the first capacitor 9 together form a resistor-capacitor (RC) filter circuit.

The other of the source and the drain of the feedback transistor 301 is also connected to an end of the second capacitor 10. Another end of the second capacitor 10 is connected to the charge accumulation unit FD.

A node formed between the feedback transistor 301, the first capacitor 9, and the second capacitor 10 will be referred to as a "node RD". A "node" herein refers to an electrical connection between different elements in an electrical circuit and is a concept including a wire or the like that electrically connects different elements to each other.

One of the band control signal lines CON1 is connected to a gate of the feedback transistor 301.

The reset circuit 4A includes the reset transistor 400.

The reset transistor 400 includes the charge accumulation unit FD as either a source or a drain thereof. The node RD is connected to another of the source and the drain of the reset transistor 400. A gate of the reset transistor 400 is connected to one of reset control signal lines CON2.

A state of the reset transistor 400 is determined on the basis of a voltage of the reset control signal line CON2. When the voltage of the reset control signal line CON2 is at a high level, for example, the reset transistor 400 is on. In this state, the charge accumulation unit FD is reset to a reference voltage VR2.

Figure 4:
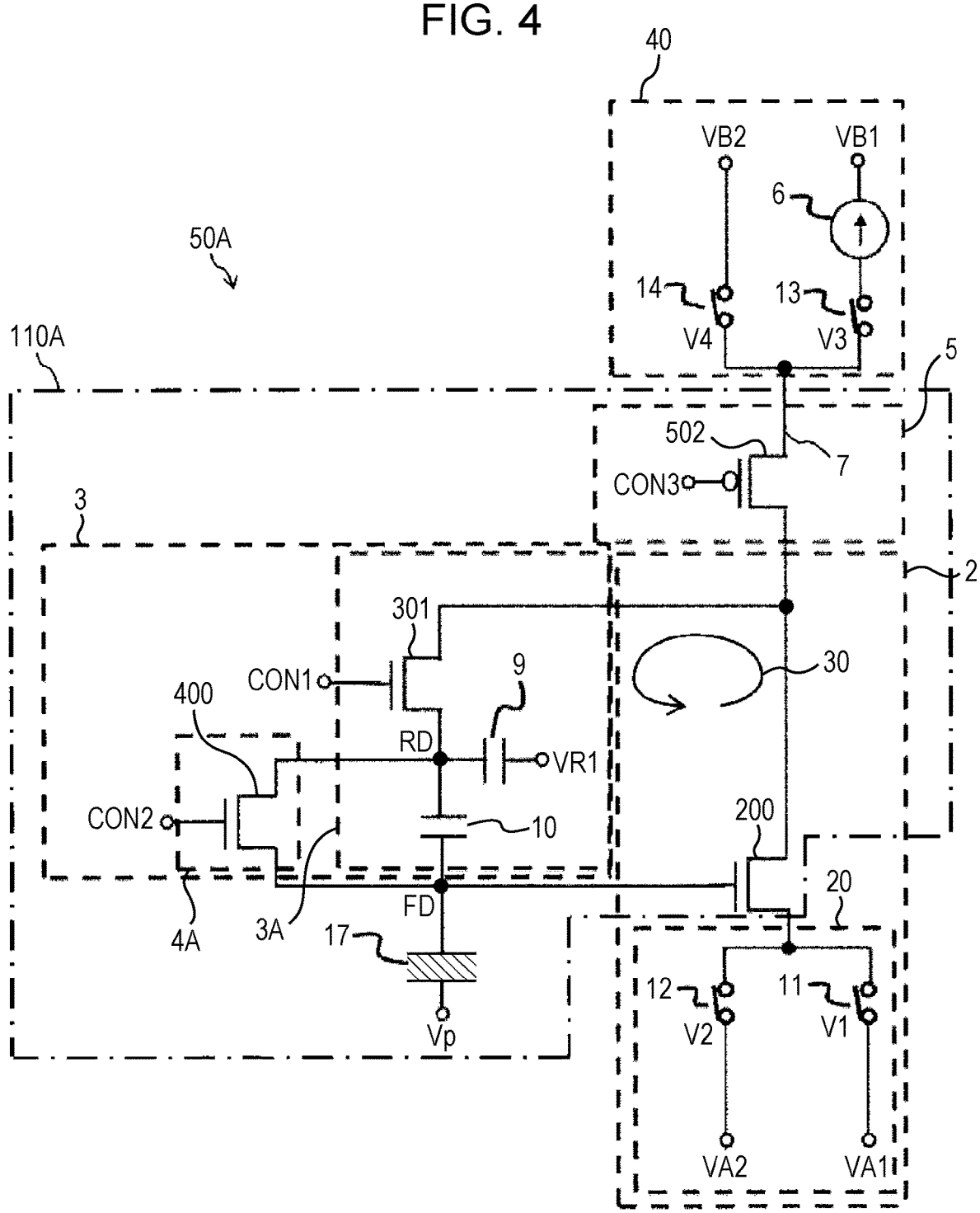
FIG. 4 is a schematic diagram illustrating an exemplary circuit configuration of the pixel and a reading circuit according to the first embodiment.

In the reading circuit 50A illustrated in FIG. 4, a voltage of the node RD is applied to the reset transistor 400. In doing so, changes in a voltage of the charge accumulation unit FD before and after the reset transistor 400 is turned off can be reduced, thereby achieving high-speed noise suppression.

The output selection unit 5 includes the selection transistor 502.

In the present embodiment, the selection transistor 502 has a polarity opposite to that of the amplifier transistor 200. More specifically, the amplifier transistor 200 is an NMOS. The selection transistor 502 is a PMOS.

Either the source or the drain of the selection transistor 502 is connected to either the source or the drain of the amplifier transistor 200. Another of the source and the drain of the selection transistor 502 is connected to the signal reading line 7.

A gate of the selection transistor 502 is connected to one of the selection control signal lines CON3. A state of the selection transistor 502 is determined on the basis of a voltage of a corresponding one of the selection control signal lines CON3.

When the voltage of the selection control signal line CON3 is at a low level, for example, the selection transistor 502 is on. In this state, the amplifier transistor 200 and the signal reading line 7 are electrically connected to each other.

When the voltage of the selection control signal line CON3 is at a high level, the selection transistor 502 is off. In this state, the amplifier transistor 200 and the signal reading line 7 are electrically isolated from each other.

When the voltage of the selection control signal line CON3 is between the low level and the high level, the selection transistor 502 operates as a current source. As a result, a current is supplied to the amplifier transistor 200. The amount of current is determined on the basis of the voltage of the selection control signal line CON3. A designer can design the reading circuit 50A in such a way as to achieve a desired current. A voltage between the low level and the high level is, for example, a middle voltage between the low level and the high level.

A switching circuit 40 is connected to the signal reading line 7. The switching circuit 40 includes a third switch element 13, a fourth switch element 14, voltage sources VB1 and VB2, and a constant current source 6. The constant current source 6 corresponds to one of the constant current sources 144 illustrated in FIG. 1.

A terminal of the constant current source 6 can be connected to the signal reading line 7 through the third switch element 13. The voltage source VB2 can be connected to the signal reading line 7 through the fourth switch element 14. The voltage source VB1 is connected to another terminal of the constant current source 6.

A control signal V3 can be supplied to the third switch element 13. A control signal V4 can be supplied to the fourth switch element 14. Whether the voltage source VB2 or the constant current source 6 is connected to the signal reading line 7 can be switched using the control signals V3 and V4.

A voltage Vb1 of the voltage source VB1 is, for example, the ground voltage GND. A voltage Vb2 of the voltage source VB2 is, for example, the power supply voltage VDD.

When the voltage source VB2 is connected to the signal reading line 7 and the voltage of the selection control signal line CON3 is between the low level and the high level, the selection transistor 502 operates as a current source. In this case, the selection transistor 502 and the amplifier transistor 200 together form an inverting amplifier circuit. A voltage between the low level and the high level is, for example, a middle voltage between the low level and the high level.

When the constant current source 6 is connected to the signal reading line 7 and the voltage of the selection control signal line CON3 is at the low level, the amplifier transistor 200 and the constant current source 6 together form a source follower circuit. In this case, a signal according to signal charge accumulated in the charge accumulation unit FD is output to the signal reading line 7 and read from the outside.

The constant current source 6 may be provided for each pixel 110A. Alternatively, the constant current source 6 may be shared by some pixels 110A. Sharing of the constant current source 6 is advantageous in view of reducing the number of elements used for each pixel.

In the imaging device 100, the feedback circuit 30 is formed. The feedback circuit 30 feeds, as negative feedback, a signal of the photoelectric conversion unit 17 back to the charge accumulation unit FD through the amplifier transistor 200.

A state of the feedback transistor 301 is determined on the basis of a voltage of a corresponding one of the band control signal lines CON1.

When the voltage of the band control signal line CON1 is at the high level, for example, the feedback transistor 301 is on. In this case, the charge accumulation unit FD, the amplifier transistor 200, the feedback transistor 301, and the second capacitor 10 together form the feedback circuit 30.

As the voltage of the band control signal line CON1 decreases, the resistance of the feedback transistor 301 increases. As a result, a band of the feedback transistor 301 becomes narrower, and a frequency range of a feedback signal becomes smaller.

While the feedback circuit 30 is formed, a signal output from the feedback transistor 301 is attenuated by an attenuation circuit including the second capacitor 10 and a parasitic capacitor of the charge accumulation unit FD and fed back to the charge accumulation unit FD.

When the voltage of the band control signal line CON1 becomes even lower and reaches the low level, the feedback transistor 301 turns off. In an off state, the feedback circuit 30 is not formed.

Refer to Japanese Patent No. 6323813 as for details of the operation and control of the imaging device 100 according to the first embodiment. The same holds for a second embodiment.

Some other embodiments will be described hereinafter. In the following description, elements common to the above-described embodiment and the following embodiments will be given the same reference numerals, and description thereof is omitted. Description of each of the embodiments can be applied to the other embodiments insofar as no technical contradiction is caused. The embodiments may be combined together insofar as no technical contradiction is caused.

Second Embodiment

Figure 5:
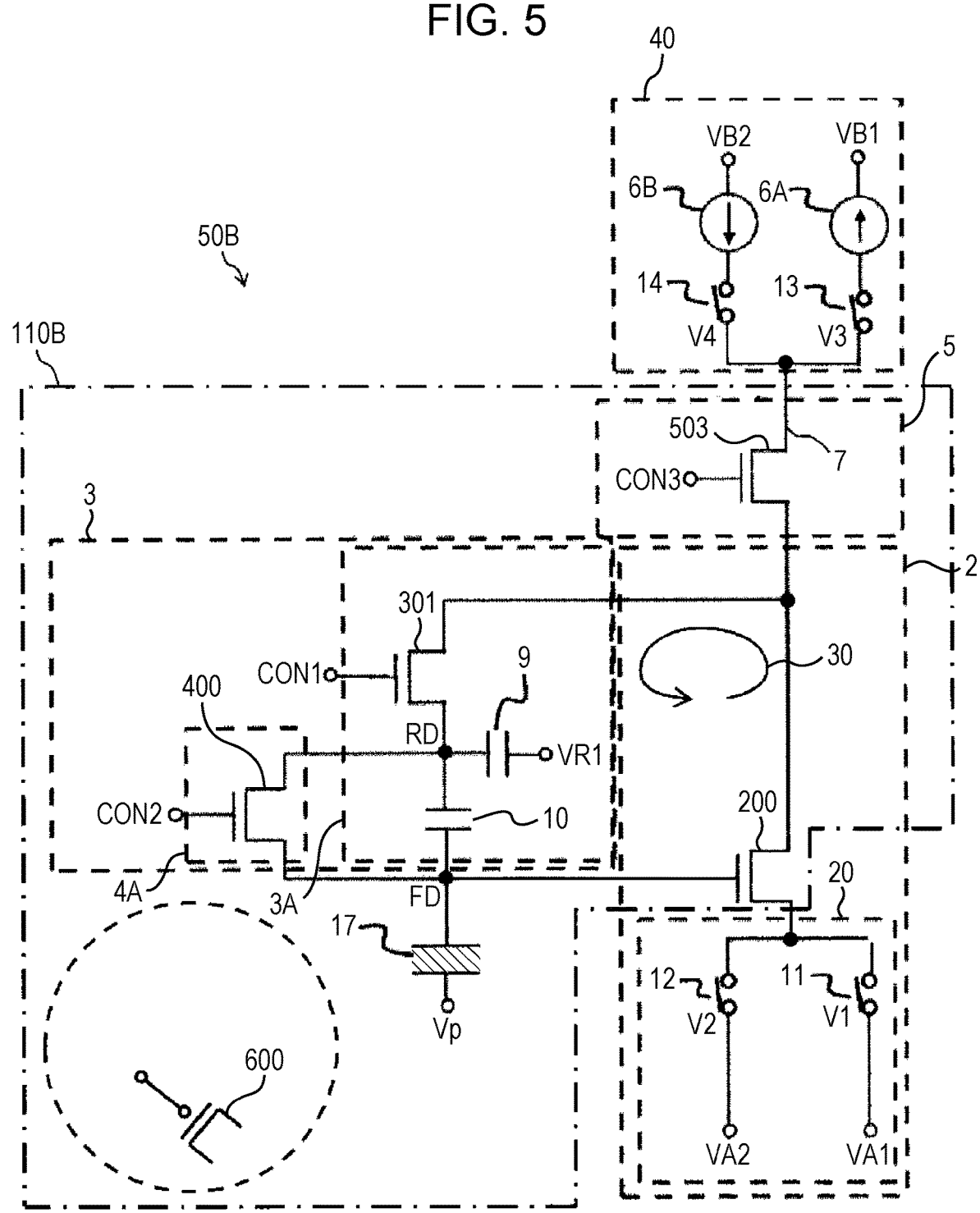
FIG. 5 is a schematic diagram illustrating an exemplary circuit configuration of a pixel and a reading circuit according to a second embodiment.

The second embodiment will be described hereinafter. FIG. 5 illustrates a pixel 110B and a reading circuit 50B according to the second embodiment.

In the reading circuit 50B illustrated in FIG. 5, the switching circuit 40 includes constant current sources 6A and 6B. The output selection unit 5 includes a selection transistor 503 instead of the selection transistor 502. A polarity of the selection transistor 503 is the same as that of the amplifier transistor 200 or the like. In this example, the selection transistor 503 is an NMOS.

The constant current source 6A corresponds to the constant current source 6 illustrated in FIG. 4 or the like. That is, the constant current source 6A corresponds to one of the constant current sources 144 illustrated in FIG. 1.

A gate of the selection transistor 503 is connected to a corresponding one of the selection control signal lines CON3. A state of the selection transistor 503 is determined on the basis of the voltage of the selection control signal line CON3.

When the voltage of the selection control signal line CON3 is at the high level, for example, the selection transistor 503 is on. In this state, the amplifier transistor 200 and the signal reading line 7 are electrically connected to each other.

When the voltage of the selection control signal line CON3 is at the low level, the selection transistor 503 is off. In this state, the amplifier transistor 200 and the signal reading line 7 are electrically isolated from each other.

In the second embodiment, by turning on the fourth switch element 14 and the selection transistor 503, a current flows from the constant current source 6B to the amplifier transistor 200.

In the imaging device 100 according to the second embodiment, the pixel 110B includes an inverter transistor 600 in addition to the amplifier transistor 200, the feedback transistor 301, the reset transistor 400, and the selection transistor 503. The inverter transistor 600 has a polarity opposite to those of the amplifier transistor 200, the feedback transistor 301, the reset transistor 400, and the selection transistor 503. In this example, the inverter transistor 600 is a PMOS. The amplifier transistor 200, the feedback transistor 301, the reset transistor 400, and the selection transistor 503 are NMOSs.

The inverter transistor 600 and another transistor having a polarity opposite to that of the inverter transistor 600 can together achieve a CMOS circuit. Using the CMOS circuit, a circuit having a specific function can be achieved. Using the CMOS circuit, for example, an inverter that performs A/D conversion can be achieved.

In the case of a so-called "multilayer imaging device", in which photoelectric conversion units 17 are stacked on a semiconductor substrate 60, it is easy to secure a space on the semiconductor substrate 60 where a CMOS circuit is to be formed. In the case of an imaging device employing photodiodes, however, a CMOS can be formed using the inverter transistor 600.

The inverter transistor 600 may or may not be included in the reading circuit 50B. The other transistor that achieves a CMOS circuit together with the inverter transistor 600 may be one of the illustrated transistors or a transistor that is not illustrated.

Plan View and Cross-Sectional View

Figure 6:
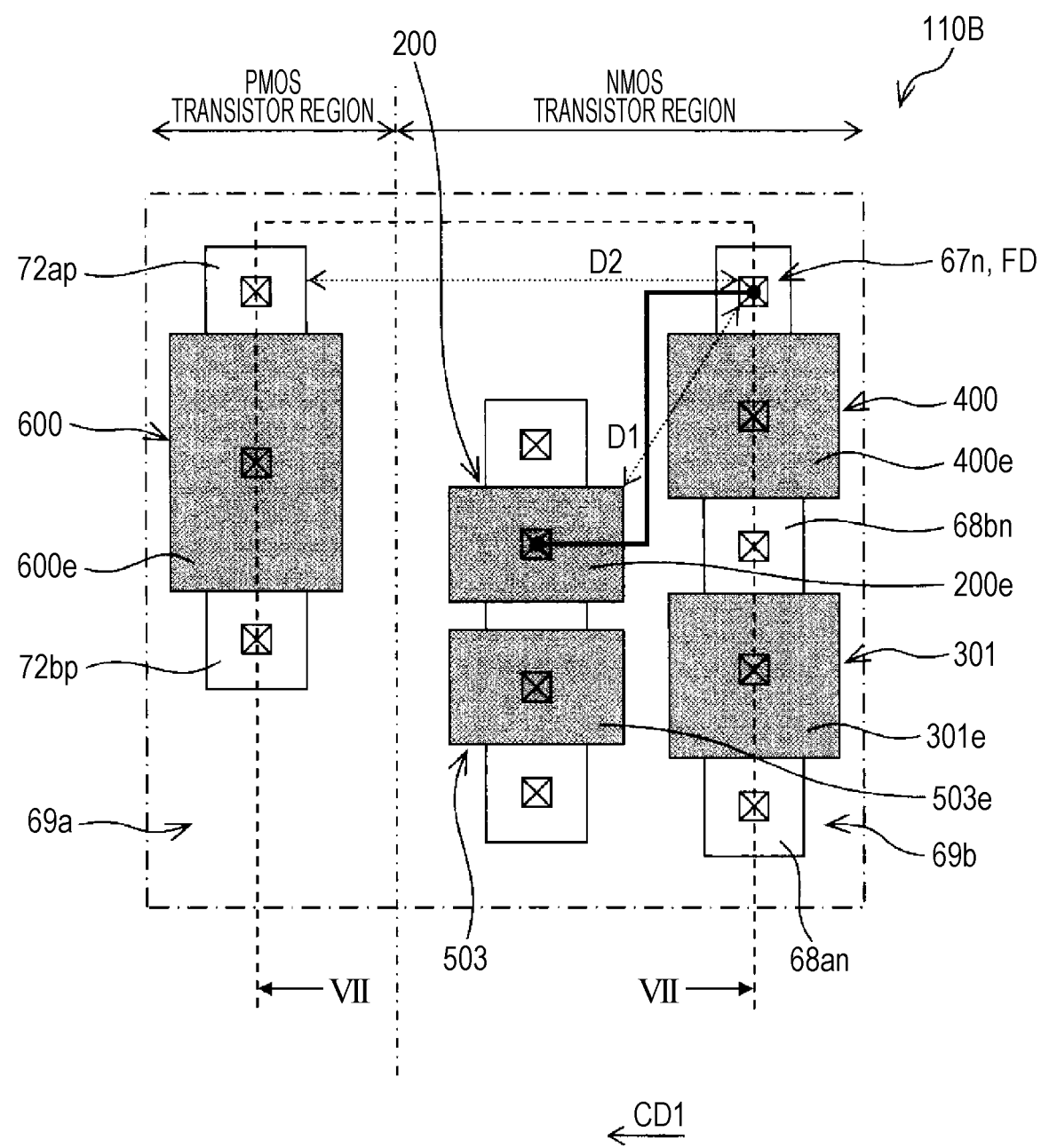
FIG. 6 is a schematic plan view illustrating an example of a layout of elements in the pixel according to the second embodiment.
Figure 7:
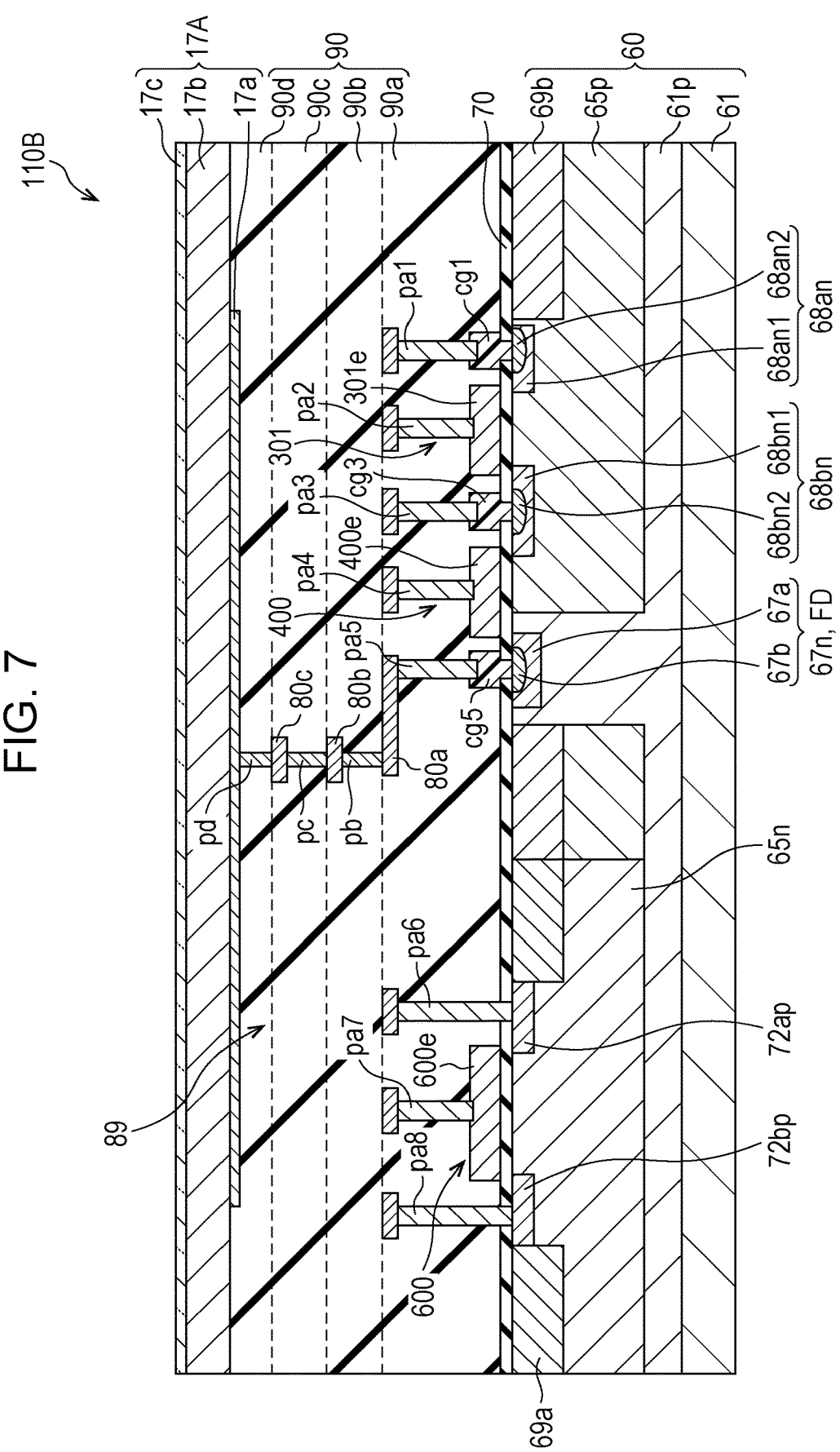
FIG. 7 is a cross-sectional view schematically illustrating the pixel according to the second embodiment.

FIG. 6 is a schematic plan view of the pixel 110B according to the second embodiment. FIG. 7 is a schematic cross-sectional view of the pixel 110B.

FIG. 6 schematically illustrates the arrangement of elements provided on the semiconductor substrate 60 when the pixel 110B illustrated in FIG. 7 is viewed in a normal line direction of the semiconductor substrate 60. A cross section illustrated in FIG. 7 is taken from the pixel 110B illustrated in FIG. 6 along a broken line VII-VII and developed. In FIG. 6, some elements are omitted.

The pixel 110B includes the semiconductor substrate 60, the photoelectric conversion unit 17, a conductive structure 89, and an interlayer insulating layer 90. The conductive structure 89 is provided above the semiconductor substrate 60. More specifically, the conductive structure 89 is provided on a light incident side from the semiconductor substrate 60.

The semiconductor substrate 60 includes a base substrate 61, a p-type semiconductor region 61p, a p-well 65p, an n-well 65n, diffusion regions 67n, 68an, 68bn, 72ap, and 72bp, and element isolation regions 69a and 69b.

The base substrate 61 is a p-type substrate. More specifically, the base substrate 61 is a p-type silicon substrate.

The p-type semiconductor region 61p is provided on the base substrate 61. The p-type semiconductor region 61p contains a p-type impurity with a concentration lower than in the base substrate 61.

The p-well 65p is provided in the p-type semiconductor region 61p. The p-well 65p contains a p-type impurity with a concentration lower than in the base substrate 61 and higher than in the p-type semiconductor region 61p.

The n-well 65n is provided in the p-type semiconductor region 61p. The n-well 65n contains an n-type impurity.

A p-well is a p-type impurity region. An n-well is an n-type impurity region.

In FIG. 6, an "NMOS transistor region" refers to a region in which the p-well 65p extends when viewed in plan. A "PMOS transistor region" refers to a region in which the n-well 65n extends when viewed in plan.

As illustrated in FIG. 7, an insulating layer 70 is provided on the semiconductor substrate 60. More specifically, the insulating layer 70 covers a large area on the semiconductor substrate 60.

The reset transistor 400 includes the diffusion region 67n as either the source or the drain thereof. The reset transistor 400 includes the diffusion region 68bn as another of the source and the drain thereof. The reset transistor 400 includes the insulating layer 70 and a gate electrode 400e. The gate electrode 400e is provided on the insulating layer 70.

The diffusion region 67n is the charge accumulation unit FD. The diffusion region 67n temporarily accumulates signal charge generated by the photoelectric conversion unit 17. In FIG. 6, a thick line indicates that the charge accumulation unit FD and a gate electrode 200e of the amplifier transistor 200 are electrically connected to each other.

The feedback transistor 301 includes the diffusion region 68an as either the source or the drain thereof. The feedback transistor 301 includes the diffusion region 68bn as another of the source and the drain thereof. The feedback transistor 301 includes the insulating layer 70 and a gate electrode 301e. The gate electrode 301e is provided on the insulating layer 70.

The inverter transistor 600 includes the diffusion region 72bp as either a source or a drain thereof. The inverter transistor 600 includes the diffusion region 72ap as another of the source and the drain. The inverter transistor 600 includes the insulating layer 70 and a gate electrode 600e. The gate electrode 600e is provided on the insulating layer 70.

The diffusion regions 67n, 68an, and 68bn are n-type impurity regions. The diffusion regions 72ap and 72bp are p-type impurity regions.

The diffusion region 67n is provided in the p-type semiconductor region 61p. The diffusion region 67n includes a first region 67a and a second region 67b. The second region 67b is provided in the first region 67a. The second region 67b has an impurity concentration higher than that of the first region 67a.

The diffusion regions 68an and 68bn are provided in the p-well 65p. The diffusion regions 72ap and 72bp are provided in the n-well 65n.

The inverter transistor 600 is a PMOS. The amplifier transistor 200, the feedback transistor 301, the reset transistor 400, and the selection transistor 503 are NMOSs.

The element isolation region 69a electrically isolates the inverter transistor 600, which is a PMOS, from the amplifier transistor 200, the feedback transistor 301, the reset transistor 400, and the selection transistor 503, which are NMOSs. In the present embodiment, the element isolation region 69a is a region formed through implantation isolation. In the present embodiment, the element isolation region 69a is an n-type impurity region. More specifically, in the present embodiment, the element isolation region 69a is an n-type impurity region whose impurity concentration is higher than that of the n-well 65n.

The element isolation region 69b electrically isolates the amplifier transistor 200, the feedback transistor 301, the reset transistor 400, and the selection transistor 503, which are NMOSs, from the inverter transistor 600, which is a PMOS. In the present embodiment, the element isolation region 69b is a region formed through implantation isolation. In the present embodiment, the element isolation region 69b is a p-type impurity region. More specifically, in the present embodiment, the element isolation region 69b is a p-type impurity region whose impurity concentration is higher than that of the p-well 65p.

The interlayer insulating layer 90 covers the semiconductor substrate 60. The interlayer insulating layer 90 supports the photoelectric conversion unit 17. The conductive structure 89 is provided in the interlayer insulating layer 90.

The interlayer insulating layer 90 includes insulating layers 90a, 90b, 90c, and 90d. The number of insulating layers included in the interlayer insulating layer 90 is not particularly limited.

The conductive structure 89 includes wiring layers 80a, 80b, and 80c. The conductive structure 89 includes plugs pa1, pa2, pa3, pa4, pa5, pa6, pa7, pa8, pb, pc, pd, cg1, cg3, and cg5.

The plugs will be described. The plugs are members used to connect elements to each other. A material and a structure of the plugs are not particularly limited.

Plugs are a concept including a direct plug, a via plug, and a contact plug. Materials and structures of the direct plug, a via plug, and the contact plug, for example, may be the same or different from each other.

A direct plug refers to a plug that is directly connected to a wiring layer and that is used to electrically connect a wiring layer to an element located on a semiconductor substrate side of the wiring layer.

In a specific example, the direct plug is directly connected to a wiring layer closest to the semiconductor substrate. Specific examples of the "element located on a semiconductor substrate side of the wiring layer", to which the direct plug is electrically connected, include a gate electrode, a contact plug, a diffusion region, and a conductive layer.

An example of a material of the direct plug is a metal such as copper (Cu) or tungsten (W). In the illustrated example, the material of the direct plug is tungsten.

A via plug refers to a plug electrically connects wiring layers to each other or a plug used to electrically connect a wiring layer to an element located on a photoelectric conversion unit side of the wiring layer.

A specific example of the "via plug used to electrically connect a wiring layer to an element located on a photoelectric conversion unit side of the wiring layer" electrically connects a wiring layer closest to a pixel electrode to the pixel electrode.

An example of a material of the via plug is a metal such as copper (Cu) or tungsten (W). A specific example of the material of the via plug is copper.

A contact plug is a plug containing an impurity of a first conductivity type or a second conductivity type. The first and second conductivity types are different from each other. The first conductivity type is an n-type or a p-type. The second conductivity type is a p-type or an n-type.

A contact plug is connected, for example, to a diffusion region or a gate electrode.

In a specific example, a contact plug is provided in a pixel between a direct plug and a diffusion region or between a direct plug and a gate electrode.

In a specific example, a contact plug provided between a first element and a second element achieves a contact resistance between the first element and the contact plug lower than a default resistance and a contact resistance between the second element and the contact plug lower than the default resistance. The default resistance is a contact resistance between the first element and the second element at a time when the first and second elements are directly connected to each other. A contact plug achieves, for example, a low contact resistance when provided between a direct plug as the first element and a diffusion region as the second element.

An example of a material of the contact plug is polysilicon.

In the illustrated example, the plugs pb, pc, and pd are via plugs. The plugs pa1, pa2, pa3, pa4, pa5, pa6, pa7, and pa8 are direct plugs. The plugs cg1, cg3, and cg5 are contact plugs. The plugs cg1, cg3, and cg5 each include a film-shaped part.

The plugs pa6, pa8, cg1, cg3, and cg5 penetrate the insulating layer 70.

The number of wiring layers included in the conductive structure 89 is not particularly limited. The number of plugs included in the conductive structure 89 is not particularly limited.

The wiring layers can include a part or the entirety of the band control signal lines CON1, the reset control signal lines CON2, and the selection control signal lines CON3.

The plugs cg1, cg3, cg5, pa1, pa2, pa3, pa4, pa5, pa6, pa7, and pa8 are provided in an insulating layer 90a. The wiring layer 80a is provided in the insulating layer 90a.

The plug pb and the wiring layer 80b are provided in an insulating layer 90b. The plug pc and the wiring layer 80c are provided in an insulating layer 90c. The plug pd is provided in the insulating layer 90d.

The wiring layer 80a is electrically connected to the diffusion region 68an through the plugs pa1 and cg1 in this order. The wiring layer 80a is electrically connected to the diffusion region 68bn through the plugs pa3 and cg3 in this order. The wiring layer 80a is electrically connected to the diffusion region 72ap through the plug pa6. The wiring layer 80a is electrically connected to the diffusion region 72bp through the plug pa8.

More specifically, the diffusion region 68an includes a first region 68an1 and a second region 68an2. The second region 68an2 is provided in the first region 68an1. The second region 68an2 has an impurity concentration higher than that of the first region 68an1. The plug cg1 is connected to the second region 68an2.

The diffusion region 68bn includes a first region 68bn1 and a second region 68bn2. The second region 68bn2 is provided in the first region 68bn1. The second region 68bn2 has an impurity concentration higher than that of the first region 68bn1. The plug cg3 is connected to the second region 68bn2.

The wiring layer 80a is electrically connected to the gate electrode 301e through the plug pa2. The wiring layer 80a is electrically connected to the gate electrode 400e through the plug pa4. The wiring layer 80a is electrically connected to the gate electrode 600e through the plug pa7.

The pixel electrode 17a is electrically connected to the diffusion region 67n, that is, the charge accumulation unit FD, through the conductive structure 89. More specifically, the pixel electrode 17a is electrically connected to the diffusion region 67n through the plug pd, the wiring layer 80c, the plug pc, the wiring layer 80b, the plug pb, the wiring layer 80a, the plug pa5, and the plug cg5 in this order. More specifically, the plug cg5 is connected to the second region 67b of the diffusion region 67n.

In the present embodiment, the wiring layers 80a, 80b, and 80c are composed of a metal such as copper or tungsten or a metal compound such as a metal nitride or a metal oxide. The same holds for the plugs (more specifically, the direct plugs) pa1 to pa8 and the plugs (more specifically, the via plugs) pb to pd.

In the illustrated example, the number of electrical paths connecting the wiring layer 80a and the diffusion region 72ap to each other is one, and more specifically, the electrical path is achieved by a plug. The number of electrical paths provided in parallel with each other to connect the wiring layer 80a and the diffusion region 72ap to each other may be two or more, and more specifically, the parallel electrical paths may be achieved by plugs. In this case, contact resistances between the electrical paths and the diffusion region 72ap can be reduced compared to when the number of electrical paths is one. Performance of the inverter transistor 600 also improves. The same holds for the number of electrical paths connecting the wiring layer 80a and the diffusion region 72bp to each other.

In the present embodiment, the plugs (more specifically, the contact plugs) cg1, cg3, and cg5 are composed of polysilicon. Conductivity of the plugs cg1, cg3, and cg5, therefore, are high, and contact resistances between the plugs cg1, cg3, and cg5 and the diffusion regions 68*an*, 68*bn*, and 67*n* can be reduced. This also improves performance of the feedback transistor 301 and the reset transistor 400.

In the present embodiment, the plugs cg1, cg3, and cg5 are n-type polysilicon plugs doped with an n-type impurity. The n-type impurity is, for example, phosphorus.

In the present embodiment, the plugs cg1, cg3, and cg5 and the gate electrodes 301*e* and 400*e* each include a film-shaped part. These elements are also composed of the same material. This means that these elements can be formed through the same process for forming a film, which is advantageous in view of simplifying a fabrication process. More specifically, the plugs cg1, cg3, and cg5 and the gate electrodes 301*e* and 400*e* are composed of polysilicon.

In the present embodiment, the photoelectric conversion unit 17 is a photoelectric conversion unit 17A including the pixel electrode 17*a*, the counter electrode 17*c*, and the photoelectric conversion layer 17*b*. The pixel electrode 17*a* is provided on the interlayer insulating layer 90. More specifically, the pixel electrode 17*a* is provided on the insulating layer 90*d*. The counter electrode 17*c* is provided on a light incident side. The photoelectric conversion layer 17*b* is provided between the pixel electrode 17*a* and the counter electrode 17*c*.

Although not illustrated in FIG. 7, the counter electrode 17*c* is connected to the above-described accumulation control line 130. In an example, the potential of the accumulation control line 130 is controlled during the operation of the imaging device 100 such that the potential of the counter electrode 17*c* becomes higher than that of the pixel electrode 17*a*. As a result, the pixel electrode 17*a* can selectively collect positive charge among positive and negative charges generated through photoelectric conversion. Since the counter electrode 17*c* is a single layer provided across pixels 110B, a predetermined potential can be collectively applied to counter electrodes 17*c* of the pixels 110B.

The pixel electrode 17*a* is electrically connected to the diffusion region 67*n*, that is, the charge accumulation unit FD, through the conductive structure 89. charge collected by the pixel electrode 17*a*, therefore, is transferred to the diffusion region 67*n* through the conductive structure 89. More specifically, the pixel electrode 17*a* is electrically connected to the diffusion region 67*n* through the plug pd, the wiring layer 80*c*, the plug pc, the wiring layer 80*b*, the plug pb, the wiring layer 80*a*, the plug pa5, and the plug cg5 in this order. Charge collected by the pixel electrode 17*a*, therefore, is transferred to the diffusion region 67*n* through these components in the above order.

The present embodiment will be further described using terms such as "first transistor" and "second transistor".

The pixel 110B includes the photoelectric conversion unit 17, the charge accumulation unit FD, the amplification transistor 200, which is a first transistor, and the inverter transistor 600, which is a second transistor. The photoelectric conversion unit 17 converts light into charge. The charge accumulation unit FD accumulates charge generated by the photoelectric conversion unit 17. The charge accumulation unit FD is a diffusion region of the first conductivity type. The first transistor includes a source or a drain containing an impurity of the first conductivity type. The second transistor includes a source or a drain containing an impurity of the second conductivity type. The second conductivity type is different from the first conductivity type.

In the present embodiment, a conductivity type is different between the charge accumulation unit FD and the source or the drain of the second transistor. In this case, the source or the drain of the second transistor might affect the charge accumulation unit FD. An example of such an effect is diffusion, from the second transistor to the charge accumulation unit FD, of an impurity of a conductivity type different from that of the impurity contained in the charge accumulation unit FD. Another example of the effect is an inflow of parasitic carriers generated in the second transistor to the charge accumulation unit FD. This effect tends to be evident when a pixel size is reduced. This effect can cause leak current and increase noise. The noise can deteriorate an image.

In the present embodiment, however, a distance D2 in plan view between the charge accumulation unit FD and the inverter transistor 600, which is the second transistor, is larger than a distance D1 between the charge accumulation unit FD and the amplification transistor 200, which is the first transistor, as illustrated in FIG. 6. The above effect, therefore, can be suppressed. As a result, the present embodiment is suitable for reducing noise and obtaining a high-quality image.

"Plan view" herein refers to observation in a direction perpendicular to a surface of the semiconductor substrate 60. FIG. 6 illustrates the pixel 110B in plan view.

In the first example, the distance D2 is a minimum gap in plan view between the charge accumulation unit FD and the source or the drain of the inverter transistor 600, which is the second transistor. The distance D1 is a minimum gap in plan view between the charge accumulation unit FD and the gate electrode 200*e* of the amplification transistor 200, which is the first transistor. FIG. 6 illustrates the distances D1 and D2 in the first example.

In a typical example, outer edges of sources, drains, and diffusion regions such as the charge accumulation unit FD are defined by junctions where the concentration of an impurity of the first conductivity type and the concentration of an impurity of the second conductivity type are the same.

In a second example, the distance D2 is a distance in plan view between the center of the charge accumulation unit FD and the center of the source or the drain of the inverter transistor 600, which is the second transistor. The distance D1 is a distance in plan view between the center of the charge accumulation unit FD and the center of the gate electrode 200*e* of the amplification transistor 200, which is the first transistor. In this context, the "center" refers to a geometric center.

In a third example, the distance D2 is a distance in plan view between a connection between the charge accumulation unit FD and the conductive structure 89 and a connection between the source or the drain of the inverter transistor 600, which is the second transistor, and the conductive structure 89. The distance D1 is a distance in plan view between a connection between the charge accumulation unit FD and the conductive structure 89 and a connection between the gate electrode 200*e* of the amplification transistor 200, which is the first transistor, and the conductive structure 89.

In a fourth example, the distance D2 is a distance in plan view between the center of the charge accumulation unit FD and the center of the gate electrode 600*e* of the inverter transistor 600, which is the second transistor. The distance D1 is a distance in plan view between the center of the charge accumulation unit FD and the center of the gate electrode 200*e* of the amplification transistor 200, which is the first transistor. In this context, the "center" refers to a geometric center.

If the distance D2 is larger than the distance D1 in plan view in any of the first to fourth examples, it is determined in the present embodiment that the distance D2 is larger than the distance D1 in plan view.

In the present embodiment, the charge accumulation unit FD, the amplification transistor 200, which is the first transistor, and the inverter transistor 600, which is the second transistor, are provided on the same semiconductor substrate 60. In this case, the above effect tends to be evident. In the present embodiment, therefore, an effect of suppressing the above effect on the basis of a relationship between the distances D2 and D1 is effectively produced.

In the present embodiment, the first transistor is the amplification transistor 200. The amplification transistor 200 generates a signal according to charge accumulated in the charge accumulation unit FD. The second transistor is the inverter transistor 600.

In the present embodiment, the amplification transistor 200, which is the first transistor, is electrically connected to the charge accumulation unit FD. More specifically, a gate of the first transistor is electrically connected to the charge accumulation unit FD. The inverter transistor 600, which is the second transistor may be electrically connected to the charge accumulation unit FD.

In the present embodiment, the amplification transistor 200, which is the first transistor, is located in a first central region, which is a central region of the pixel 110B, in plan view. In this case, it is easy to make the distance D2 larger than the distance D1 in plan view. A "first central region of a pixel in plan view" refers to a region whose shape in plan view is similar to that of the pixel, whose area is 70% of that of the pixel, and whose geometric center is the same as that of the pixel. The first transistor is considered to be located in a central region in plan view when the entirety of a source, a drain, and a gate electrode of the first transistor is located, in plan view, within an outer edge that defines the central region.

In plan view, the amplification transistor 200, which is the first transistor, may be located in a second central region of the pixel 110B. A "second central region of a pixel in plan view" refers to a region whose shape in plan view is similar to that of the pixel, whose area is 40% of that of the pixel, and whose geometric center is the same as that of the pixel.

In plan view, the amplification transistor 200, which is the first transistor, may be located in a third central region of the pixel 110B. A "third central region of a pixel in plan view" refers to a region whose shape in plan view is similar to that of the pixel, whose area is 10% of that of the pixel, and whose geometric center is the same as that of the pixel.

An outer edge of a pixel can be understood, for example, from an arrangement pattern of pixels. A pixel is a minimum unit capable of expressing a tone.

In the present embodiment, the charge accumulation unit FD and the inverter transistor 600, which is the second transistor, are located on opposite sides of the amplification transistor 200, which is the first transistor, in a direction CD1 in plan view. In other words, in plan view, the charge accumulation unit FD, the first transistor, and the second transistor are arranged in the direction CD1 in this order. In this case, it is easy to make the distance D2 larger than the distance D1 in plan view.

In the illustrated example, the direction CD1 is the row direction. The direction CD1 may be the column direction, instead.

In the present embodiment, the first conductivity type is an n-type. The second conductivity type is a p-type.

More specifically, in the present embodiment, the amplification transistor 200 includes a source or a drain containing an n-type impurity. In this case, mutual conductance of the amplification transistor 200 can be easily secured compared to when the amplification transistor 200 includes a source or a drain containing a p-type impurity. This is because electrons are more mobile than holes. It is advantageous in view of securing performance of the amplification transistor 200 that mutual conductance can be easily secured.

In the present embodiment, the pixel 110B includes a first well region 65p and a second well region 65n. The first well region 65p contains an impurity of the second conductivity type. The amplification transistor 200, which is the first transistor, is located in the first well region 65p. The second well region 65n contains an impurity of the first conductivity type. The inverter transistor 600, which is the second transistor, is located in the second well region 65n. The area of the first well region 65p is larger than that of the second well region 65n in plan view. More specifically, the area of the first well region 65p belonging to the pixel 110B is larger than that of the second well region 65n belonging to the pixel 110B in plan view.

In the present embodiment, the first well region 65p is the p-well 65p. The second well region 65n is the n-well 65n.

In the present embodiment, the imaging device 100 includes the semiconductor substrate 60, In a cross section (also referred to as a "first cross section") perpendicular to a main surface of the semiconductor substrate 60, the source or the drain of the amplification transistor 200, which is the first transistor, and the source or the drain of the inverter transistor 600, which is the second transistor, are observed. In this context, the source or the drain of the first transistor refers to at least either the source or the drain of the first transistor. The same holds for the source or the drain of the second transistor.

More specifically, in this cross section, the source and the drain of the first transistor and the source and the drain of the second transistor are observed. The charge accumulation unit FD is also observed in this cross section.

The pixel 110B includes the element isolation regions 69a and 69b. The element isolation region 69a isolates the inverter transistor 600, which is the second transistor, from other elements. The element isolation region 69b isolates, from other elements, the reset transistor 400 whose polarity is opposite to that of the second transistor. The element isolation regions 69a and 69b are formed through implantation isolation.

The arrangement of the elements illustrated in the plan view of FIG. 6 may be applied to other embodiments. In embodiments where elements that are absent in the present embodiment are added, such elements may be added to the plan view of FIG. 6. In embodiments where elements that are present in the present embodiment are absent, such elements may be removed from the plan view of FIG. 6.

Figure 8:
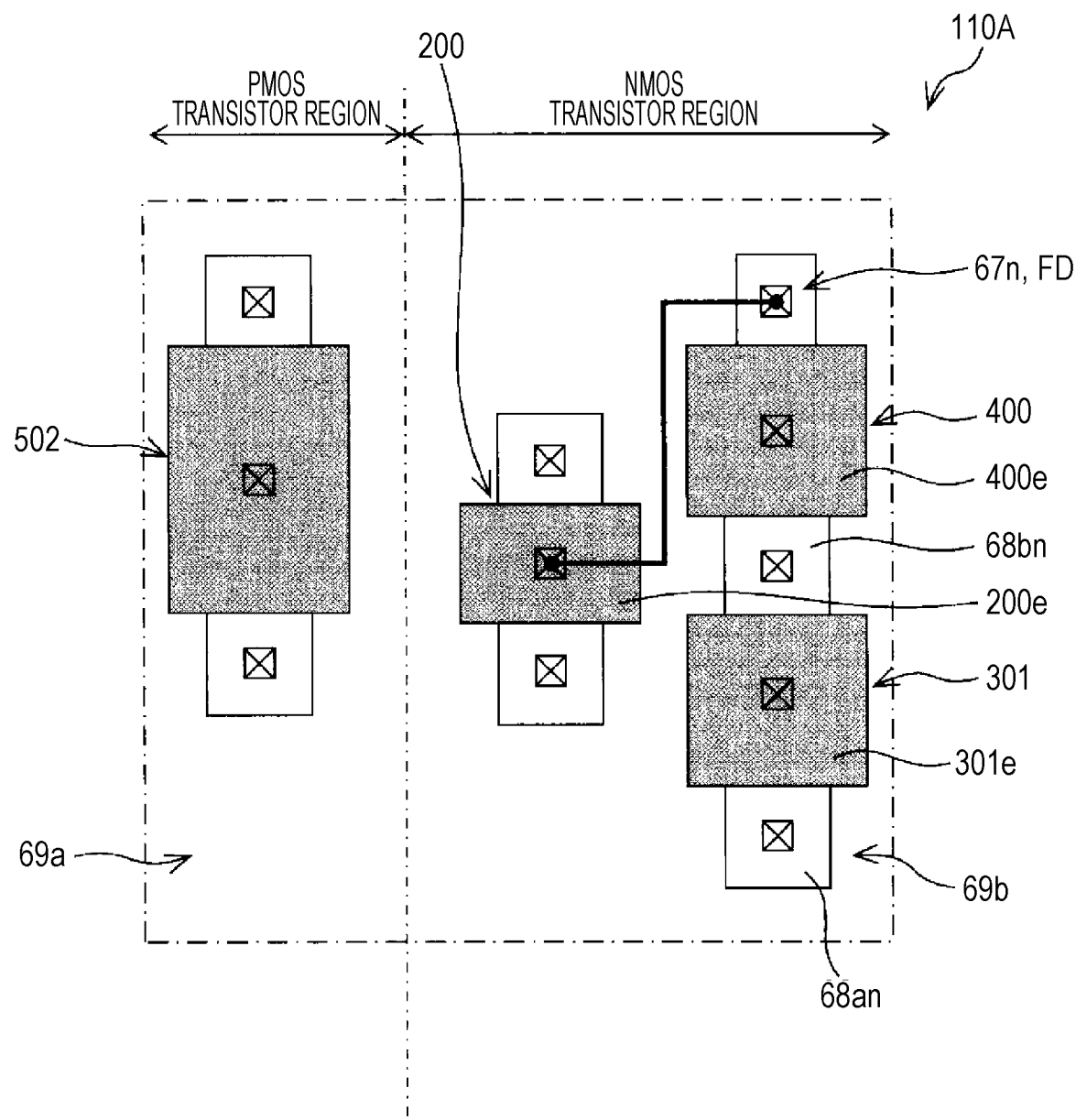
FIG. 8 is a schematic plan view illustrating an example of a layout of elements in the pixel according to the first embodiment.

As for the first embodiment, for example, the selection transistor 503 may be removed from the plan view of FIG. 6, the selection transistor 502 may be used as the inverter transistor 600, and other modifications may be made. FIG. 8 is a plan view that may be applied to the first embodiment.

Third Embodiment

Figure 9:
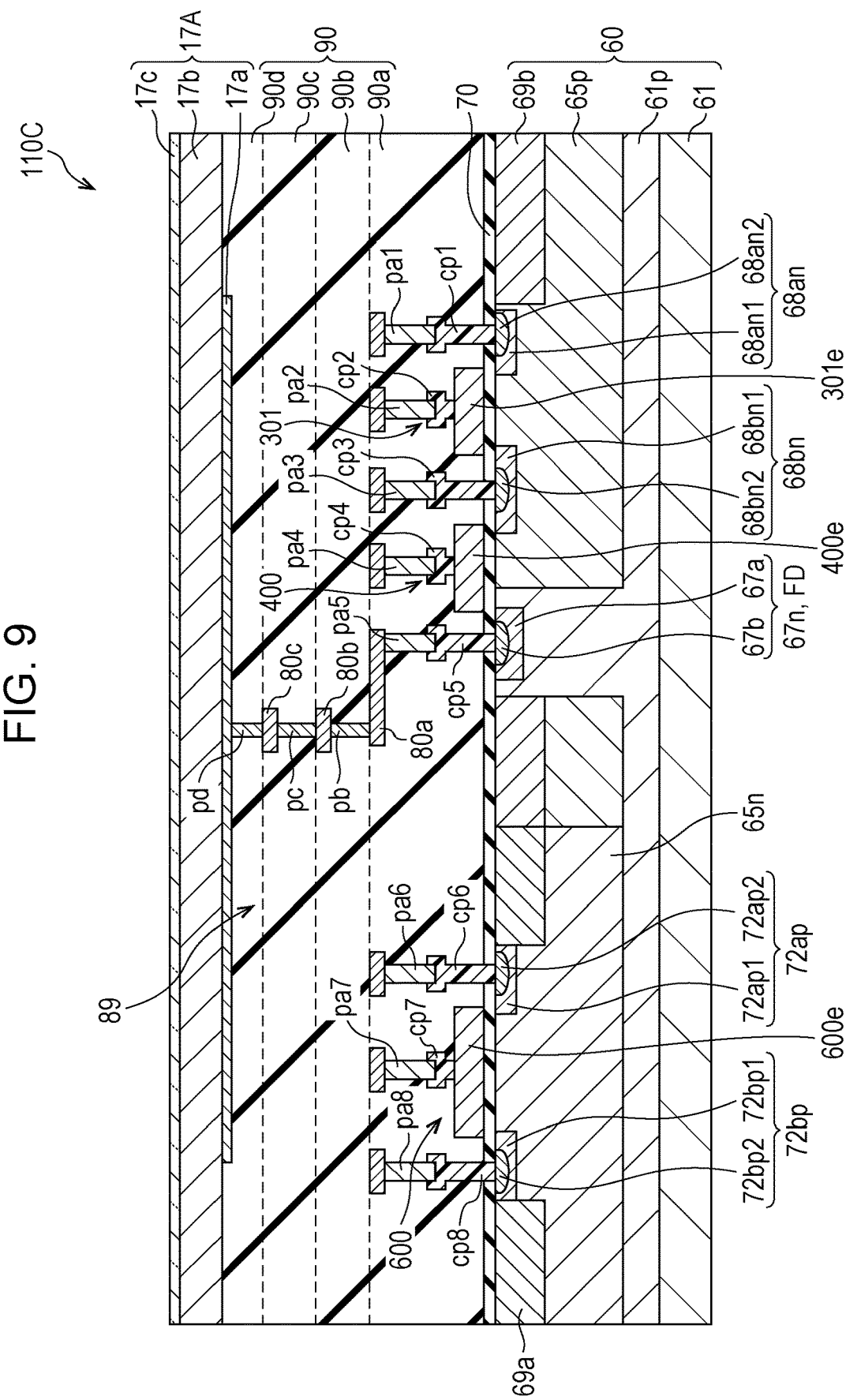
FIG. 9 is a cross-sectional view schematically illustrating a pixel according to a third embodiment.

A pixel 110C according to a third embodiment will be described hereinafter. FIG. 9 is a schematic cross-sectional view of the pixel 110C.

In the pixel 110C, the conductive structure 89 includes plugs cp1, cp2, cp3, cp4, cp5, cp6, cp7, and cp8. These plugs are provided in the insulating layer 90a. These plugs each include a stick-shaped part. More specifically, these plugs are contact plugs.

The plugs cp1, cp3, cp5, cp6, and cp8 penetrate the insulating layer 70.

The wiring layer 80a is electrically connected to the diffusion region 68an through the plugs pa1 and cp1 in this order. The wiring layer 80a is electrically connected to the diffusion region 68bn through the plugs pa3 and cp3 in this order. The wiring layer 80a is electrically connected to the diffusion region 72ap through the plugs pa6 and cp6 in this order. The wiring layer 80a is electrically connected to the diffusion region 72bp through the plugs pa8 and cp8 in this order.

More specifically, the plug cp1 is connected to the second region 68an2 of the diffusion region 68an. The plug cp3 is connected to the second region 68bn2 of the diffusion region 68bn.

The diffusion region 72ap includes a first region 72ap1 and a second region 72ap2. The second region 72ap2 is provided in the first region 72ap1. The second region 72ap2 has an impurity concentration higher than that of the first region 72ap1. The plug cp6 is connected to the second region 72ap2.

The diffusion region 72bp includes a first region 72bp1 and a second region 72bp2. The second region 72bp2 is provided in the first region 72bp1. The second region 72bp2 has an impurity concentration higher than that of the first region 72bp1. The plug cp8 is connected to the second region 72bp2.

The wiring layer 80a is electrically connected to the gate electrode 301e through the plugs pa2 and cp2 in this order. The wiring layer 80a is electrically connected to the gate electrode 400e through the plugs pa4 and cp4 in this order. The wiring layer 80a is electrically connected to the gate electrode 600e through the plugs pa1 and cp7 in this order.

The pixel electrode 17a is electrically connected to the diffusion region 67n, that is, the charge accumulation unit FD, through the conductive structure 89. More specifically, the pixel electrode 17a is electrically connected to the diffusion region 67n through the plug pd, the wiring layer 80c, the plug pc, the wiring layer 80b, the plug pb, the wiring layer 80a, the plug pa5, and the plug cp5 in this order.

In the present embodiment, the plugs (more specifically, the contact plugs) cp1 to cp8 are composed of polysilicon. As a result, conductivity of the plugs cp1, cp3, cp5, cp6, and cp8 can be increased, and contact resistances between the plugs cp1, cp3, cp5, cp6, and cp8 and the diffusion regions 68an, 68bn, 67n, 72ap, and 72bp can be reduced. In addition, conductivity of the plugs cp2, cp4, and cp7 can be increased, and contact resistances between the plugs cp2, cp4, and cp7 and the gate electrodes 301e, 400e, and 600e can be reduced. This can improve the performance of the feedback transistor 301, the reset transistor 400, and the inverter transistor 600.

In the present embodiment, the plugs cp1 to cp5 are n-type polysilicon plugs doped with an n-type impurity. The n-type impurity is, for example, phosphorus.

In the present embodiment, the plugs cp6 to cp8 are p-type polysilicon plugs doped with a p-type impurity. The p-type impurity is, for example, boron.

Figure 10:
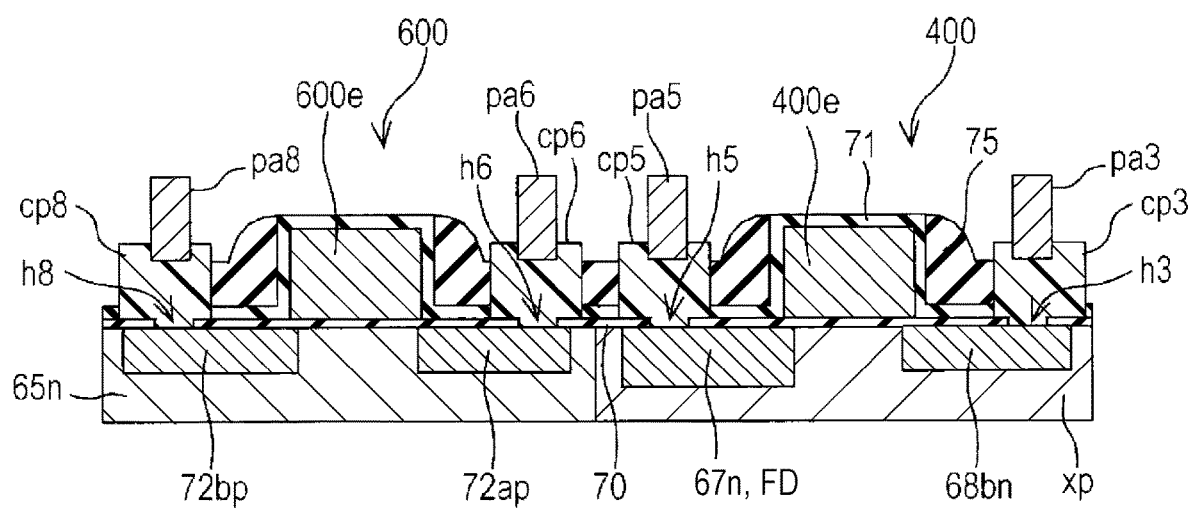
FIG. 10 is a cross-sectional view schematically illustrating an example of a configuration applicable to the pixel according to the third embodiment.

FIG. 10 illustrates an example of a configuration applicable to the pixel 110C. The configuration illustrated in FIG. 10 can be applied to other embodiments.

In FIG. 10, some elements such as the element isolation regions 69a and 69b are omitted. In FIG. 10, a region xp is a combination of the p-type semiconductor region 61p and the p-well 65p.

In the example illustrated in FIG. 10, an insulating layer 71 is provided in such a way as to cover the gate electrodes 400e and 600e. The insulating layer 71 is, for example, a silicon oxide film. The insulating layer 71 may have a multilayer structure.

Sidewalls 75 are provided on the insulating layer 71. The sidewalls 75 are, for example, silicon nitride films.

The sidewalls 75 are provided between the plug cp3 and the gate electrode 400e, between the plug cp5 and the gate electrode 400e, between the plugs cp5 and cp6, between the plug cp6 and the gate electrode 600e, and between the plug cp8 and the gate electrode 600e.

In plan view, the sidewalls 75 overlap the diffusion regions 68bn, 67n, 72ap, and 72bp.

When two elements overlap in plan view, the two elements at least partly overlap each other in plan view.

Because of the overlap, damage to the diffusion regions 68bn, 67n, 72ap, and 72bp and contamination due to diffusion of metal can be reduced. The damage is, for example, damage due to plasma used in a process after diffusion regions are formed. The damage due to plasma is, for example, physical damage due to collision with accelerated ions and generation of defects due to light. The light is, for example, ultraviolet light.

The sidewalls 75 may be provided between other plugs and gate electrodes, instead. The sidewalls 75 may be provided in such a way as to overlap other diffusion regions in plan view, instead.

The insulating layers 70 and 71 have contact holes h3, h5, h6, and h8. These contact holes penetrate the insulating layers 70 and 71.

In plan view, the contact hole h3 overlaps the diffusion region 68bn. The plug cp3 is provided in the contact hole h3.

In plan view, the contact hole h5 overlaps the diffusion region 67n. The plug cp5 is provided in the contact hole h5.

In plan view, the contact hole h6 overlaps the diffusion region 72ap. The plug cp6 is provided in the contact hole h6.

In plan view, the contact hole h8 overlaps the diffusion region 72bp. The plug cp8 is provided in the contact hole h8.

Contact holes may be formed at positions overlapping other diffusion regions in plan view, and plugs may be provided in the contact holes, instead.

Fourth Embodiment

Figure 11:
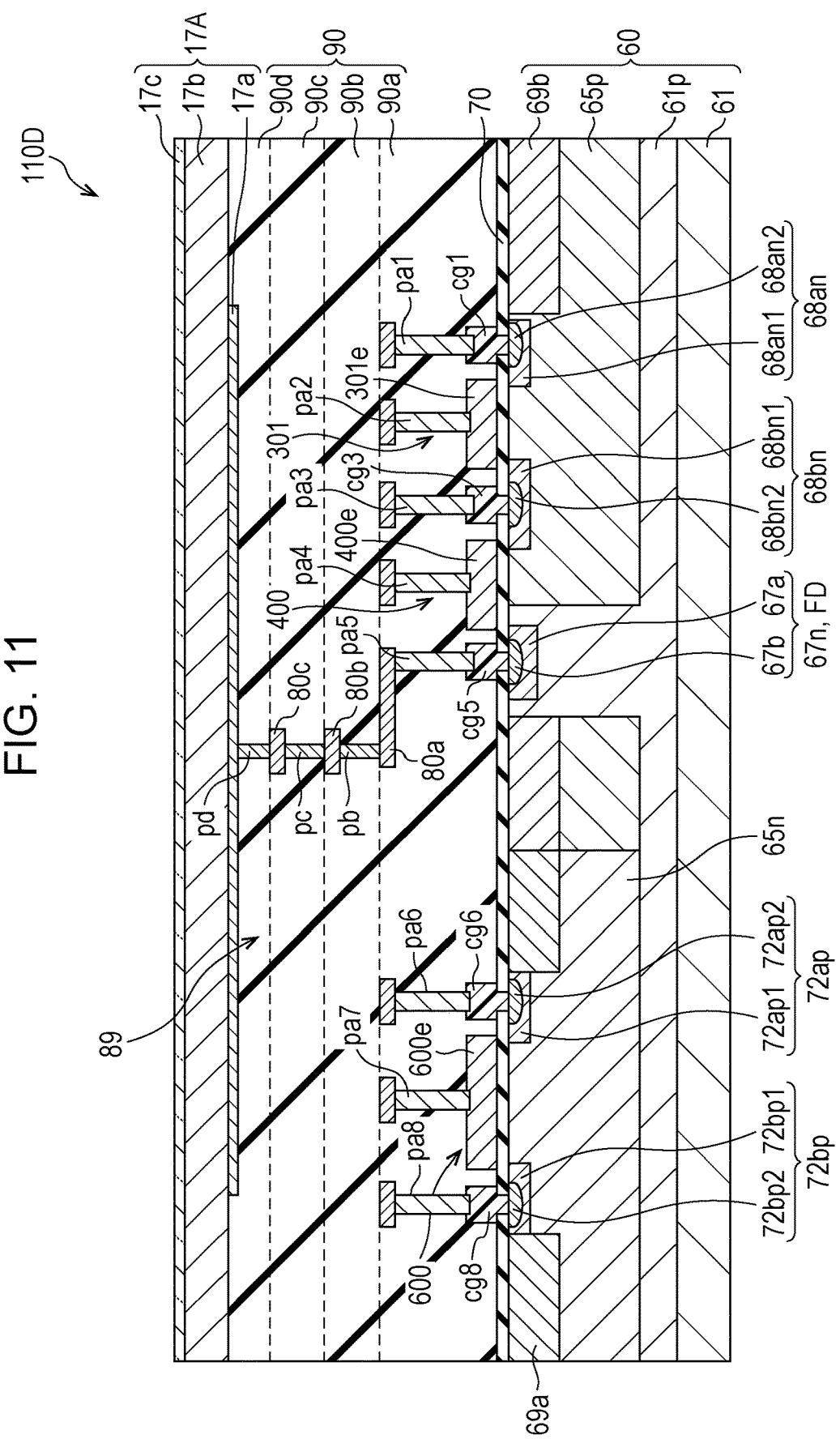
FIG. 11 is a cross-sectional view schematically illustrating a pixel according to a fourth embodiment.

A pixel 110D according to a fourth embodiment will be described. FIG. 11 is a schematic cross-sectional view of the pixel 110D.

In the pixel 110D, the conductive structure 89 includes plugs cg6 and cg8. The plugs cg6 and cg8 are provided in the insulating layer 90a.

In the illustrated example, the plugs cg6 and cg8 each include a film-shaped part. The plugs cg6 and cg8 are contact plugs.

The plugs cg6 and cg8 penetrate the insulating layer 70.

The wiring layer 80a is electrically connected to the diffusion region 72ap through the plugs pa6 and cg6 in this order. The wiring layer 80a is electrically connected to the diffusion region 72bp through the plugs pa8 and cg8 in this order.

More specifically, the plug cg6 is connected to the second region 72*ap*2 of the diffusion region 72*ap*. The plug cg8 is connected to the second region 72*bp*2 of the diffusion region 72*bp*.

In the present embodiment, the plugs cg6 and cg8 (more specifically, the contact plugs) are composed of polysilicon. As a result, conductivity of the plugs cg6 and cg8 can be increased, and contact resistances between the plugs cg6 and cg8 and the diffusion regions 72*ap* and 72*bp* can be reduced. This can improve the performance of the inverter transistor 600.

In the present embodiment, the plugs cg6 and cg8 are p-type polysilicon plugs doped with a p-type impurity. The p-type impurity is, for example, boron.

In the present embodiment, the plugs cg6 and cg8 and the gate electrode 600*e* each include a film-shaped part. In addition, these elements are composed of the same material. This means that these elements can be formed through the same film formation process, which is advantageous in view of simplifying a fabrication process. More specifically, the plugs cg6 and cg8 and the gate electrode 600*e* are composed for polysilicon.

The third and fourth embodiments will be further described using terms such as "first transistor" and "second transistor".

The pixels 110C and 110D each include the reset transistor 400, which is a first transistor, the inverter transistor 600, which is a second transistor, a first contact plug, and a second contact plug. The first transistor includes the diffusion region 67*n* or 68*bn* corresponding to a first diffusion region, which is a source or a drain, and the gate electrode 400*e*, which is a first gate electrode containing an impurity of the first conductivity type. The second transistor includes the diffusion region 72*ap* or 72*bp* corresponding to a second diffusion region, which is a source or a drain, and the second gate electrode 600*e* containing an impurity of the second conductivity type, which is different from the first conductivity type.

The first contact plug is connected to the diffusion region 67*n* or 68*bn*, which is the first diffusion region, and contains an impurity of the first conductivity type. The second contact plug is connected to the diffusion region 72*ap* or 72*bp*, which is the second diffusion region, and contains an impurity of the second conductivity type.

The gate electrode 400*e*, which is the first gate electrode, and the first contact plug are elements that contribute to the operation of the reset transistor 400, which is the first transistor. With the above configuration, these elements both contain an impurity of the first conductivity type. This can contribute to securing stability of the operation of the first transistor. For example, variation in quality is less likely to occur during mass production of the imaging device, which leads to obtaining of a high-quality image. The same holds for the configuration of the inverter transistor 600, which is the second transistor.

In the third embodiment, the first contact plug is the plug cp3 or cp5. The second contact plug is the plug cp6 or cp8.

In the fourth embodiment, the first contact plug is the plug cg3 or cg5. The second contact plug is the plug cg6 or cg8.

In the third and fourth embodiments, the diffusion region 67*n* or 68*bn*, which is the first diffusion region, contains an impurity of the first conductivity type. The diffusion region 72*ap* or 72*bp*, which is the second diffusion region, contains an impurity of the second conductivity type.

As described above, in the third and fourth embodiments, the conductivity types of the impurities contained in the first contact plug and the first diffusion region connected to each other are the same, namely the first conductivity type. The conductivity types of the impurities contained in the second contact plug and the second diffusion region connected to each other are the same, namely the second conductivity type. This is advantageous in view of reducing a contact resistance between the first contact plug and the first diffusion region and improving performance of the first transistor. This is also advantageous in view of reducing a contact resistance between the second contact plug and the second diffusion region and improving performance of the second transistor. These are advantageous in view of obtaining a high-quality image.

In the third and fourth embodiments, the first diffusion region includes the first region whose impurity concentration is relatively low and the second region that is provided in the first region and whose impurity concentration is relatively high. The first contact plug is connected to the second region of the first diffusion region. In this case, an effect of reducing a contact resistance on the basis of the first contact plug is likely to be produced effectively.

In the third and fourth embodiments, the second diffusion region includes the first region whose impurity concentration is relatively low and the second region that is provided in the first region and whose impurity concentration is relatively high. the second contact plug is connected to the second region of the second diffusion region. In this case, an effect of reducing a contact resistance on the basis of the second contact plug is likely to be produced effectively.

In the third and fourth embodiments, the first diffusion region is the charge accumulation unit FD. The charge accumulation unit FD accumulates charge. The first transistor is the reset transistor 400. The reset transistor 400 resets the charge accumulation unit FD. The second transistor is the inverter transistor 600.

In the third and fourth embodiments, the first region of the first diffusion region is the first region 67*a* of the charge accumulation unit FD. The second region of the first diffusion region is the second region 67*b* of the charge accumulation unit FD. The first region of the second diffusion region is the first region 72*ap*1 or 72*bp*1. The second region of the second diffusion region is the second region 72*ap*2 or 72*bp*2.

In the third and fourth embodiments, the first conductivity type is an n-type. The second conductivity type is a p-type.

Fifth Embodiment

Figure 12:
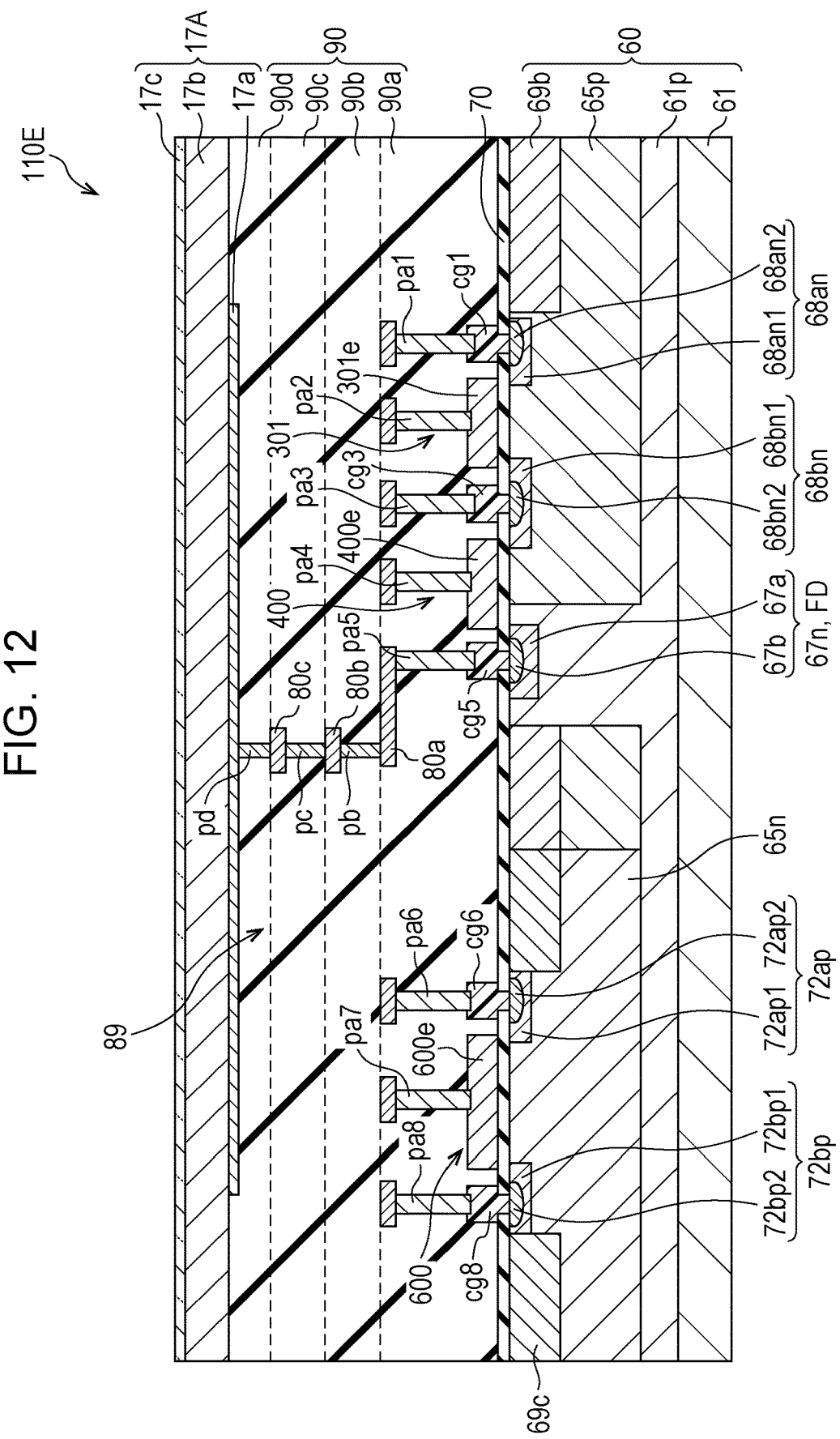
FIG. 12 is a cross-sectional view schematically illustrating a pixel according to a fifth embodiment.

A pixel 110E according to a fifth embodiment will be described. FIG. 12 is a schematic cross-sectional view of the pixel 110E.

In the pixel 110E, an element isolation region 69*c* is used instead of the element isolation region 69*a*. The element isolation region 69*c* has a shallow trench isolation (STI) structure. With the element isolation region 69*c* having the STI structure, a function of isolating elements tends to be achieved even if impurity concentrations in the source and the drain of the inverter transistor 600 are high. This is advantageous in view of reducing the contact resistances between the plugs cg6 and cg8 and the diffusion regions 72*ap* and 72*bp*. This can improve the performance of the inverter transistor 600. The excellent function of isolating elements based the STI structure can also contribute to reducing pixel size. As described above, the plugs cg6 and cg8 are contact plugs.

The element isolation region 69*b*, on the other hand, is a region formed through implantation isolation. As in the present embodiment, the element isolation region 69*c* having the STI structure and the element isolation region 69b formed through implantation isolation may be combined together.

The element isolation region 69c having the STI structure is composed of, for example, a silicon oxide.

The fifth embodiment will be further described using terms such as "first transistor" and "second transistor".

The pixel 110E includes the element isolation region 69c. The element isolation region 69c isolates the second transistor 600. The element isolation region 69c has the STI structure.

The STI structure can include crystal defects in a sidewall thereof. Crystal defects can give noise to the charge accumulation unit FD.

In the present embodiment, however, a distance D3 between the charge accumulation unit FD and the element isolation region 69c in plan view is larger than the distance D1 between the charge accumulation unit FD and the amplification transistor 200, which is the first transistor. This suppresses generation of noise due to crystal defects in the charge accumulation unit FD and is suitable for obtaining a high-quality image.

Even when the element isolation region 69c is formed through implantation isolation, the distance D3 larger than the distance D1 can contribute to improving image quality. This is because, in this case, it is possible to suppress generation of noise in the charge accumulation unit FD due to a high-concentration impurity in an implantation isolation region.

In an example, the distance D3 is a minimum gap in plan view between the charge accumulation unit FD and the element isolation region 69c. The distance D1 is a minimum gap in plan view between the charge accumulation unit FD and the gate electrode 200e of the amplification transistor 200, which is the first transistor.

In the present embodiment, the element isolation region 69c isolates the inverter transistor 600, which is the second transistor, from the amplification transistor 200, which is the first transistor.

An element is considered to be isolated from another element when a structure for suppressing leak current between the elements is provided between the elements. In an example, an element is considered to be isolated from another element when the element is surrounded by such a structure in plan view and the other element is provided outside the structure.

The pixel 110E includes the element isolation region 69b. The element isolation region 69b isolates the reset transistor 400 having a polarity opposite to that of the inverter transistor 600, which is the second transistor, from other elements. The element isolation region 69c is formed through implantation isolation.

In the present embodiment, the charge accumulation unit FD and the element isolation region 69c are located on opposite sides of the amplification transistor 200, which is the first transistor, in a specific direction in plan view. In this case, it is easy to make the distance D3 larger than the distance D1 in plan view.

Sixth Embodiment

Figure 13:
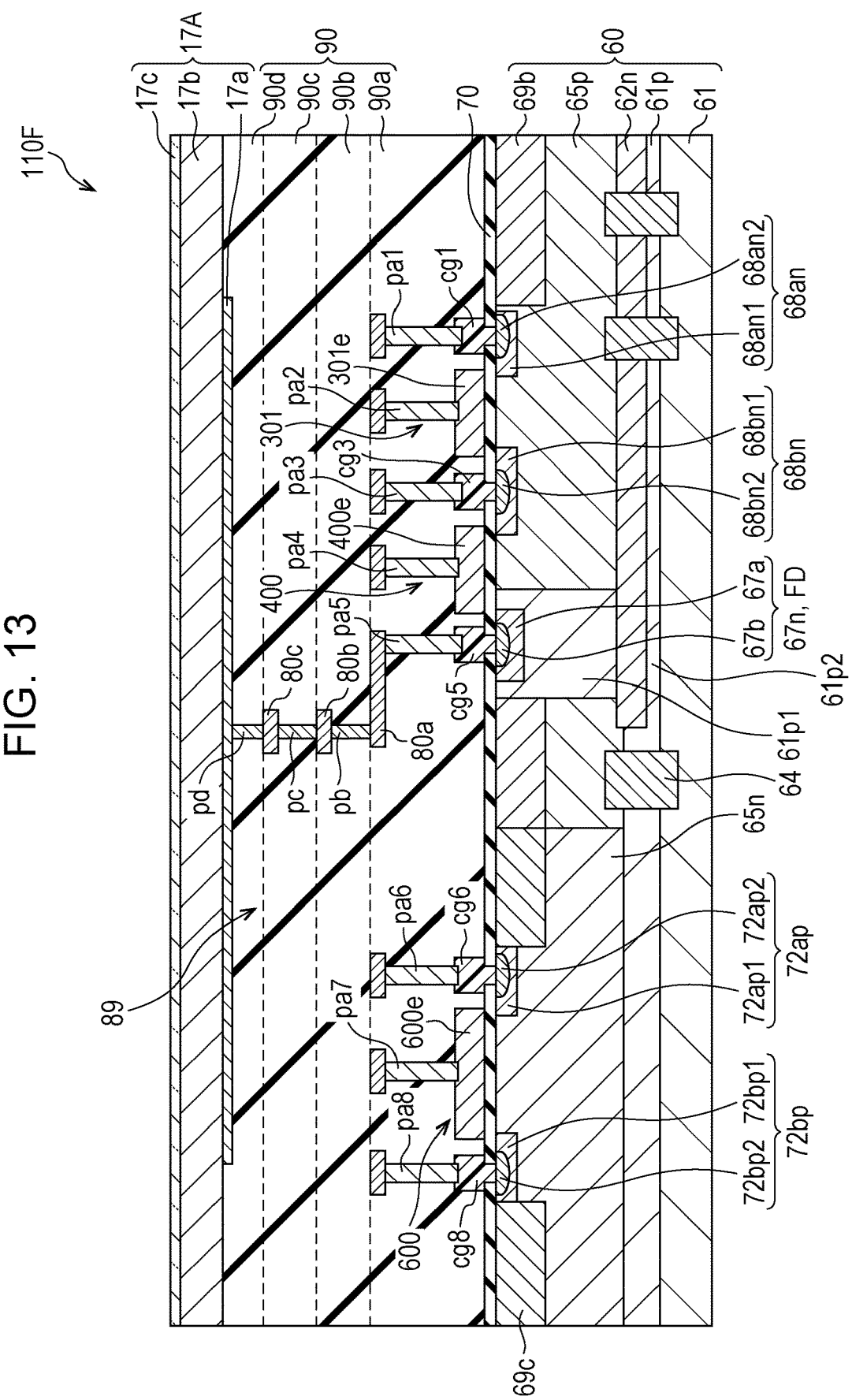
FIG. 13 is a cross-sectional view schematically illustrating a pixel according to a sixth embodiment.

A pixel 110F according to a sixth embodiment will be described hereinafter. FIG. 13 is a schematic cross-sectional view of the pixel 110F.

The pixel 110F includes an n-type semiconductor region 62n. The n-type semiconductor region 62n divides the p-type semiconductor region 61p into a first region 61p1 in which the diffusion region 67n is provided and a second region 61p2 different from the first region 61p1. With the n-type semiconductor region 62n, an inflow of a small number of carriers generated in the inverter transistor 600 or peripheral circuits to the charge accumulation unit FD can be suppressed. This is suitable for suppressing leak current due to the inflow of the small number of carriers to the charge accumulation unit FD and obtaining a high-quality image.

The base substrate 61, the second region 61p2, the n-type semiconductor region 62n, and the first region 61p1 are arranged in this order. The base substrate 61, the second region 61p2, the n-type semiconductor region 62n, and the p-well 65p are arranged in this order.

In plan view, the second region 61p2 overlaps the p-well 65p and the n-well 65n. In plan view, the second region 61p2 overlaps the charge accumulation unit FD. In plan view, the second region 61p2 overlaps at least either the diffusion region 72ap or the diffusion region 72bp. More specifically, the second region 61p2 overlaps both the diffusion regions 72ap and 72bp.

The pixel 110F includes at least one p-type region 64. More specifically, the pixel 110F includes two or more p-type region 64. The p-type region 64 has an impurity concentration higher than those of the base substrate 61 and the p-type semiconductor region 61p. The p-type region 64 electrically connects the base substrate 61, the p-type semiconductor region 61p, and the p-well 65p to one another.

The sixth embodiment will be further described using terms such as "first semiconductor region" and "second semiconductor region".

The pixel 110F includes the p-type semiconductor region 61p, which is a first semiconductor region, and the n-type semiconductor region 62n, which is a second semiconductor region. The second semiconductor region divides the first semiconductor region into the first region 61p1 and the second region 61p2 different from the first region 61p1. The charge accumulation unit FD is provided in the first region 61p1. In plan view, the second region 61p2 overlaps the n-well 65n, which is the second well region.

In the present embodiment, the second region 61p2 overlapping the second well region in plan view and the first region 61p1 in which the charge accumulation unit FD is provided are thus divided by the n-type semiconductor region 62n, which is the second semiconductor region. In the present embodiment, therefore, an inflow of a small number of carriers generated in the inverter transistor 600, which is the second transistor, to the charge accumulation unit FD can be suppressed. This is suitable for suppressing leak current due to the inflow of the small number of carriers to the charge accumulation unit FD and obtaining a high-quality image.

In the present embodiment, the first semiconductor region is the p-type semiconductor region 61p. The second semiconductor region is the n-type semiconductor region 62n. The second well region is the n-well 65n. As described above, the charge accumulation unit FD corresponds to the diffusion region 67n.

Seventh Embodiment

A pixel 110G according to a seventh embodiment will be described hereinafter.

Figure 14:
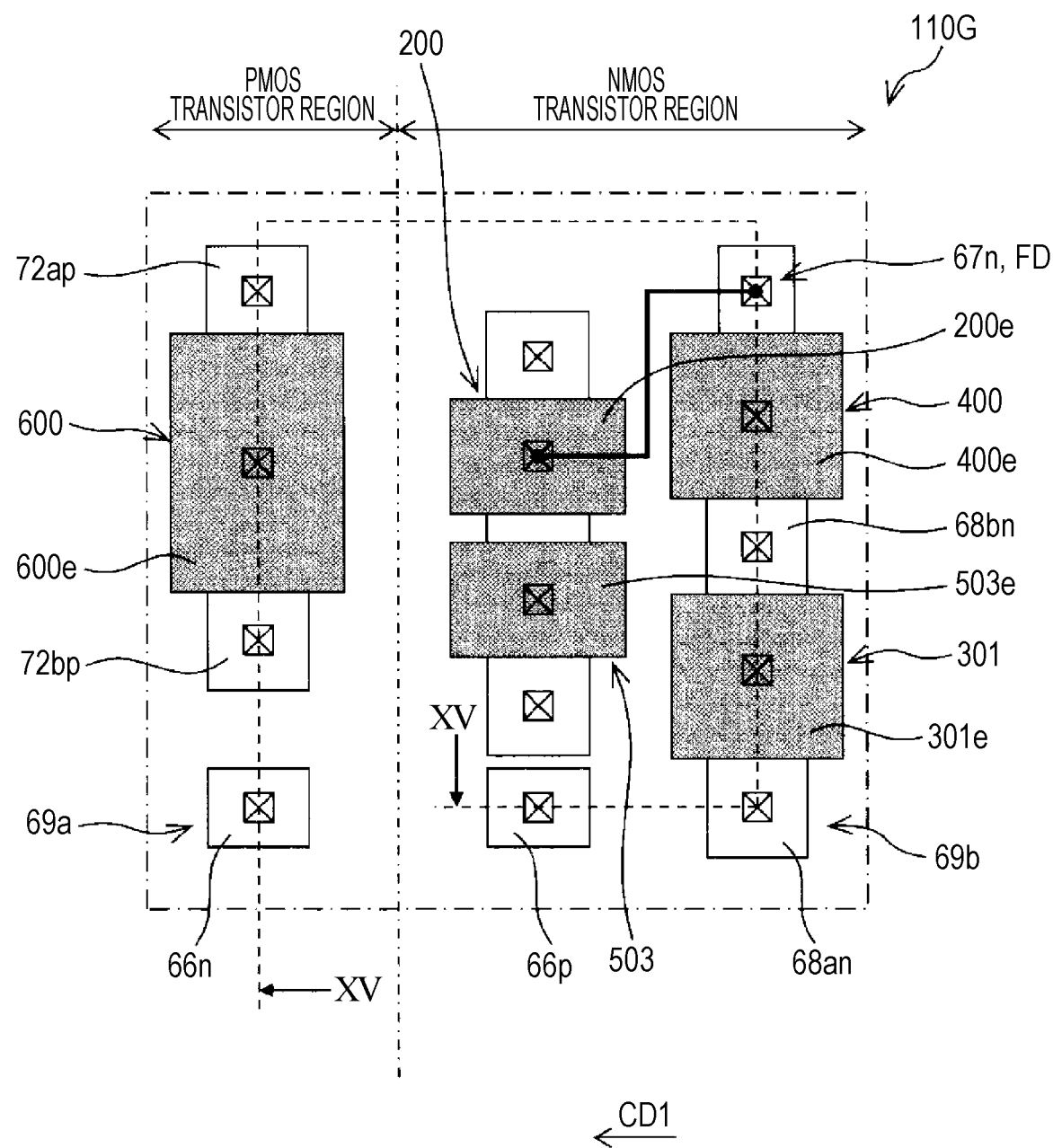
FIG. 14 is a schematic plan view illustrating an example of a layout of elements in a pixel according to a seventh embodiment.
Figure 15:
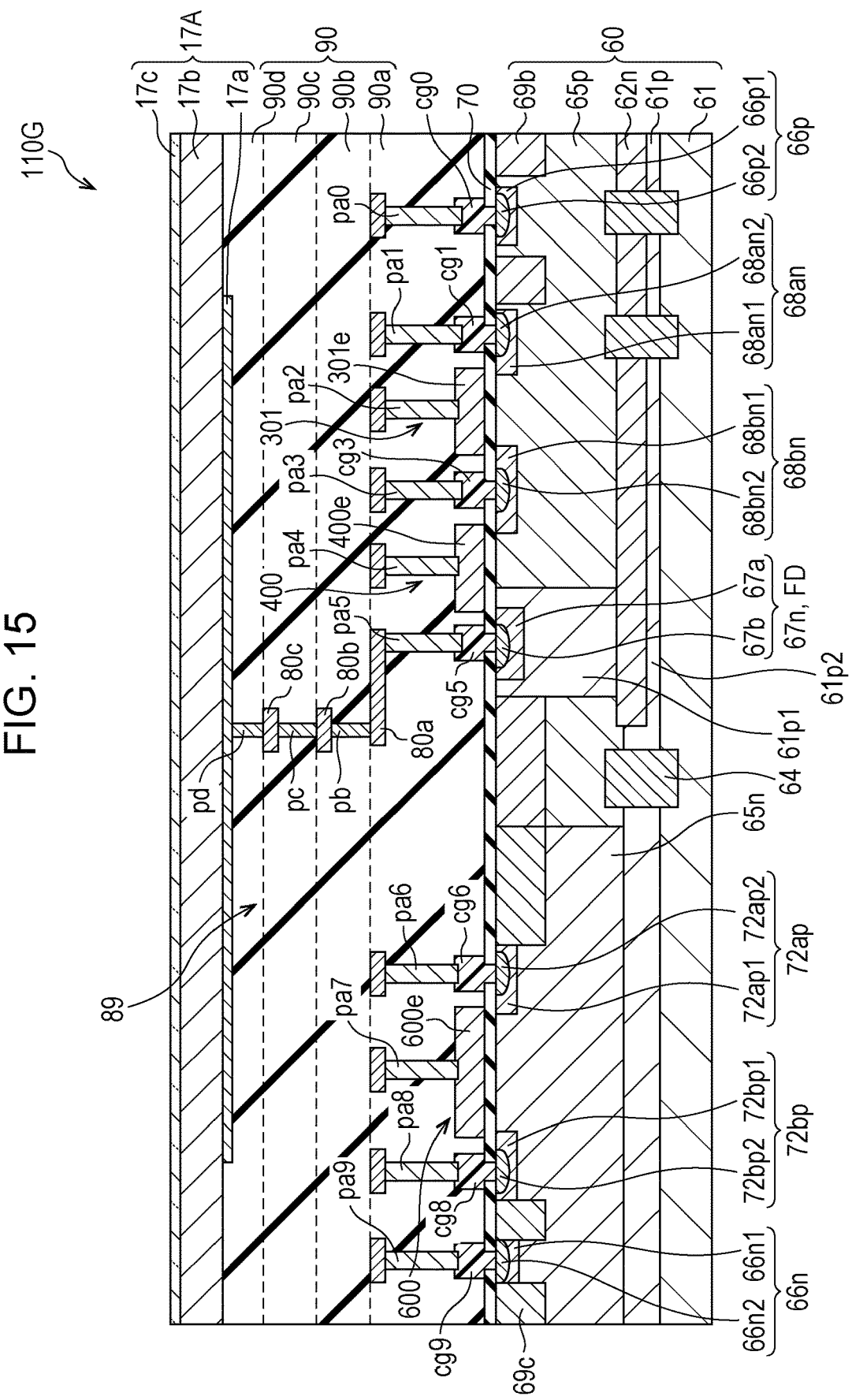
FIG. 15 is a cross-sectional view schematically illustrating the pixel according to the seventh embodiment.

FIG. 14 is a schematic plan view of the pixel 110G according to the seventh embodiment. FIG. 15 is a schematic cross-sectional view of the pixel 110G.

FIG. 14 schematically illustrates the arrangement of the elements provided on the semiconductor substrate 60 when the pixel 110G illustrated in FIG. 15 is viewed in the normal line direction of the semiconductor substrate 60. A cross section illustrated in FIG. 15 is taken from the pixel 110G illustrated in FIG. 14 along a broken line XV-XV and developed.

In the pixel 110G, the conductive structure 89 includes plugs pa0, pa9, cg0, and cg9. The semiconductor substrate 60 includes a sub-contact region 66p and a well-contact region 66n.

In the illustrated example, the plugs pa0 and pa9 are direct plugs. The plugs cg0 and cg9 each include a film-shaped part. The plugs cg0 and cg9 are contact plugs.

The plugs cg0 and cg9 penetrate the insulating layer 70.

The sub-contact region 66p contains a p-type impurity. The sub-contact region 66p is provided in the p-well 65p. The sub-contact region 66p may be formed on a p-type element isolation region. The element isolation region 69b is provided between the sub-contact region 66p and the diffusion region 68an.

The well-contact region 66n contains an n-type impurity. The well-contact region 66n is provided in the n-well 65n. The element isolation region 69c is provided between the well-contact region 66n and the diffusion region 72bp.

The plugs pa0, pa9, cg0, and cg9 are provided in the insulating layer 90a.

The wiring layer 80a is electrically connected to the sub-contact region 66p through the plugs pa0 and cg0 in this order. The wiring layer 80a is electrically connected to the well-contact region 66n through the plugs pa9 and cg9 in this order.

More specifically, the sub-contact region 66p includes a first region 66p1 and a second region 66p2. The second region 66p2 is provided in the first region 66p1. The second region 66p2 has an impurity concentration higher than that of the first region 66p1. The plug cg0 is connected to the second region 66p2.

The well-contact region 66n includes a first region 66n1 and a second region 66n2. The second region 66n2 is provided in the first region 66n1. The second region 66n2 has an impurity concentration higher than that of the first region 66n1. The plug cg9 is connected to the second region 66n2.

The plugs (more specifically, the direct plugs) pa0 and pa9 are composed of a metal such as copper or tungsten or a metal compound such as a metal nitride or a metal oxide.

The plug (more specifically, the contact plug) cg0 is composed of polysilicon. In the present embodiment, the plug cg0 is a p-type polysilicon plug doped with a p-type impurity. The p-type impurity is, for example, a boron.

The plug (more specifically, the contact plug) cg9 is composed of polysilicon. In the present embodiment, the plug cg9 is an n-type polysilicon plug doped with an n-type impurity. The n-type impurity is, for example, phosphorus.

The wiring layer 80a can supply a voltage to the p-well 65p through the plug pa0, the plug cg0, and the sub-contact region 66p in this order. The wiring layer 80a can supply a voltage to the n-well 65n through the plug pa9, the plug cg9, and the well-contact region 66n in this order. By supplying voltages in this manner, voltages of the p-well 65p and the n-well 65n become stable. Voltages of wells in each pixel become thus stable. When a pixel array includes pixels 110G, shading can be suppressed in the pixel array. The present embodiment, therefore, is suitable for obtaining a high-quality image.

In the present embodiment, one sub-contact region 66p and one well-contact region 66n are provided for each pixel 110G. One sub-contact region 66p and one well-contact region 66n, however, may be provided for two or more pixels 110G, instead. The number of pixels 110G is, for example, four.

The seventh embodiment will be further described using terms such as "first well region" and "second well region".

The pixel 110G includes the p-well 65p, which is a first well region, the n-well 65n, which is a second well region, the sub-contact region 66p, which is a first contact region, and the well-contact region 66n, which is a second contact region. The first well region contains an impurity of the second conductivity type. The amplification transistor 200, which is the first transistor, is located in the first well region. The second well region contains an impurity of the first conductivity type. The inverter transistor 600, which is the second transistor, is located in the second well region. The first contact region contains an impurity of the second conductivity type. The second contact region contains an impurity of the first conductivity type. A voltage is supplied to the first well region through the first contact region. A voltage is supplied to the second well region through the second contact region.

More specifically, in the present embodiment, a voltage is supplied to the first well region through the first contact region in each pixel 110G. A voltage is supplied to the second well region through the second contact region in each pixel 110G.

In the present embodiment, the first well region is the p-well 65p. The second well region is the n-well 65n. The first contact region is the sub-contact region 66p. The second contact region is the well-contact region 66n.

In the plan view of FIG. 14, the gate electrode 200e of the amplification transistor 200 is located slightly above the center of the pixel 110G. In the present embodiment, however, the gate electrode 200e of the amplification transistor 200 may be located at the center of the pixel 110G in plan view as in FIG. 6 or the like.

Example of Arrangement of Pixels

In a specific example, a pixel array includes pixels in the imaging device 100. An example of the arrangement of the pixels in the pixel array will be described with reference to FIG. 16. In this specific example, a pixel array AR1 in which pixels 110B according to the second embodiment are arranged will be described. A similar pixel array may be achieved using pixels described in another embodiment, instead.

One of two adjacent pixels 110B will be referred to as a "first pixel 210A" hereinafter. Another of the two adjacent pixels 110B will be referred to as a "second pixel 210B".

Figure 16:
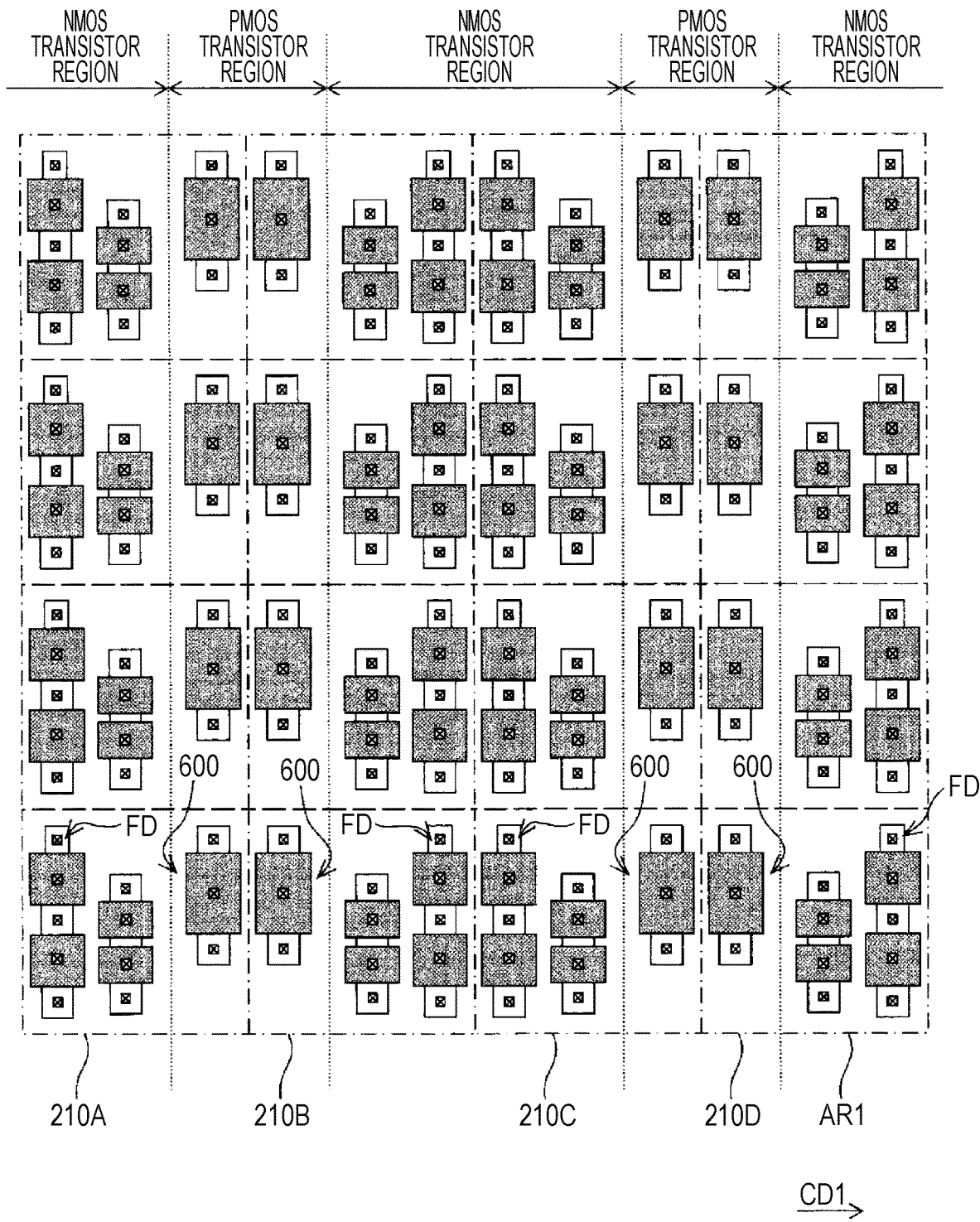
FIG. 16 is a schematic plan view illustrating an example of a layout of a pixel array.

In the example illustrated in FIG. 16, a charge accumulation unit FD of the first pixel 210A, an inverter transistor 600 that is a second transistor of the first pixel 210A, an inverter transistor 600 that is a second transistor of the second pixel 210B, and a charge accumulation unit FD of the second pixel 210B are provided in a direction CD1 in this order in plan view. In this case, a distance in plan view between the second transistor of the first pixel 210A and the charge accumulation unit FD of the second pixel 210B is unlikely to be short. In addition, a distance in plan view between the second transistor of the second pixel 210B and the charge accumulation unit FD of the first pixel 210A is unlikely to be short. This is suitable for obtaining a high-quality image.

More specifically, the configuration of the second pixel 210B is axisymmetric with that of the first pixel 210A in plan view. This arrangement can be referred to as "flip arrangement".

In FIG. 16, the second pixel 210B is laterally reversed from the first pixel 210A. In FIG. 16, however, the second pixel 210B may be longitudinally reversed from the first pixel 210A, instead. In other words, an axis of axisymmetry in plan view may extend in a column direction or a row direction. The direction CD1 may be the row direction or the column direction.

In the example illustrated in FIG. 16, the first pixel 210A and the second pixel 210B share a p-well 65p, which is a first well region. This is advantageous in view of reducing the size of the imaging device. The first pixel 210A and the second pixel 210B are considered to share a first well region when at least a part of the first well region belongs to the first pixel 210A and at least another part of the first well region belongs to the second pixel 210B.

In the example illustrated in FIG. 16, the first well region is the p-well 65p.

The first pixel 210A and the second pixel 210B may share an n-well 65n, which is a second well region. This is advantageous in view of reducing the size of the imaging device. The first pixel 210A and the second pixel 210B are considered to share a second well region when at least a part of the second well region belongs to the first pixel 210A and at least another part of the second well region belongs to the second pixel 210B. In the example illustrated in FIG. 16, the second well region is the n-well 65n.

The pixel array AR1 includes a third pixel 210C and a fourth pixel 210D. The third pixel 210C and the fourth pixel 210D correspond to the pixels 110B, respectively. The second pixel 210B and the third pixel 210C are adjacent to each other. The third pixel 210C and the fourth pixel 210D are adjacent to each other. The first pixel 210A, the second pixel 210B, the third pixel 210C, and the fourth pixel 210D are provided in the direction CD1 in this order.

In the example illustrated in FIG. 16, the charge accumulation unit FD of the first pixel 210A, the inverter transistor 600 that is the second transistor of the first pixel 210A, the inverter transistor 600 that is the second transistor of the second pixel 210B, the charge accumulation unit FD of the second pixel 210B, a charge accumulation unit FD of the third pixel 210C, an inverter transistor 600 that is a second transistor of the third pixel 210C, an inverter transistor 600 that is a second transistor of the fourth pixel 210D, and a charge accumulation unit FD of the fourth pixel 210D are provided in the direction CD1 in this order in plan view.

More specifically, the configuration of the third pixel 210C is axisymmetric with that of the second pixel 210B in plan view. The configuration of the fourth pixel 210D is axisymmetric with that of the third pixel 210C in plan view.

Example of Supply of Voltage to Pixel Array

A pixel array can include pixels in the imaging device 100. An example of supply of voltages to the pixel array will be described hereinafter with reference to FIGS. 17 to 19. In a pixel array AR2 in this specific example, pixels 110H are arranged. In the pixel array AR2, pixels described in another embodiment may be arranged, instead.

Figure 17:
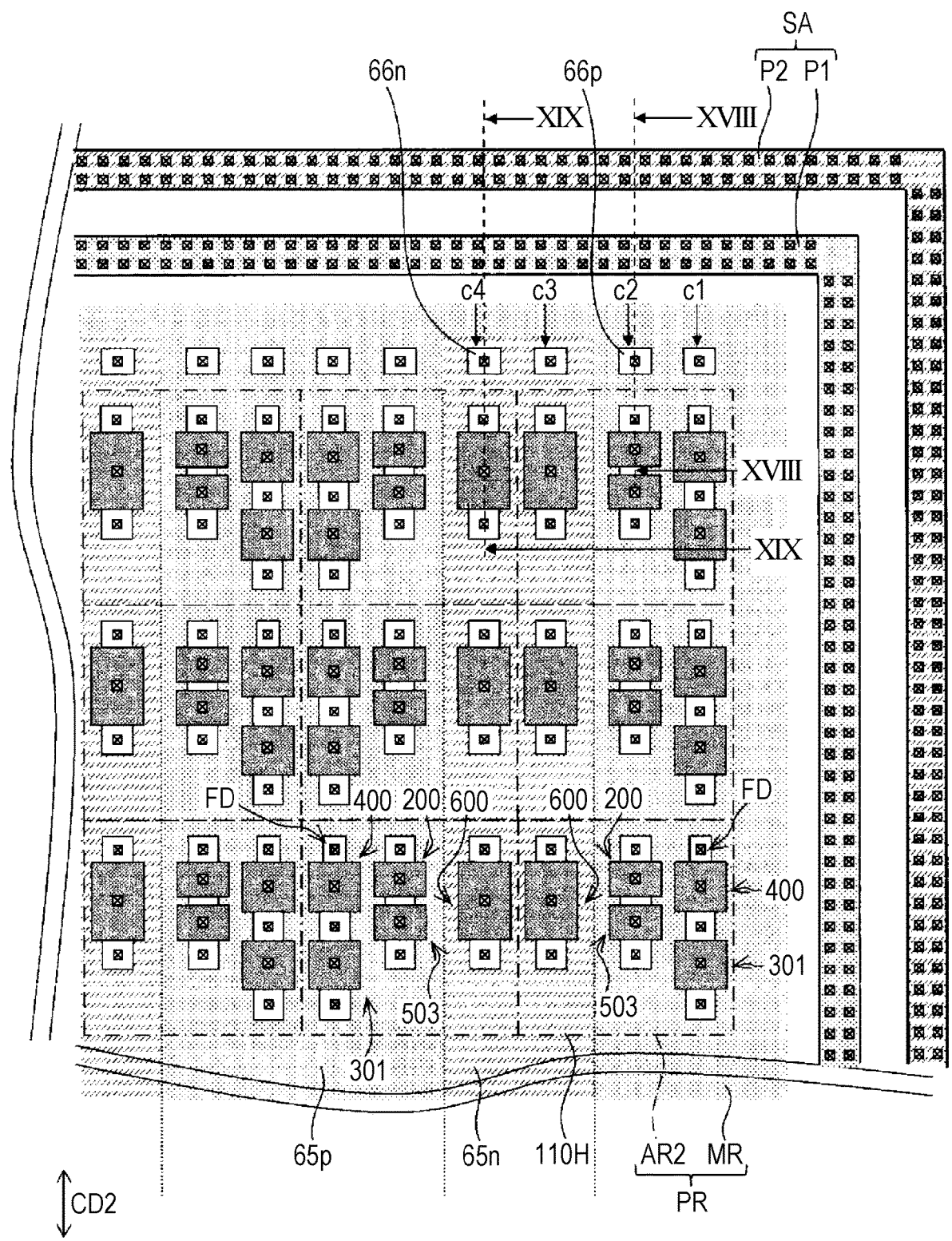
FIG. 17 is a schematic plan view illustrating an example of a layout of a pixel region and a surrounding area.
Figure 18:
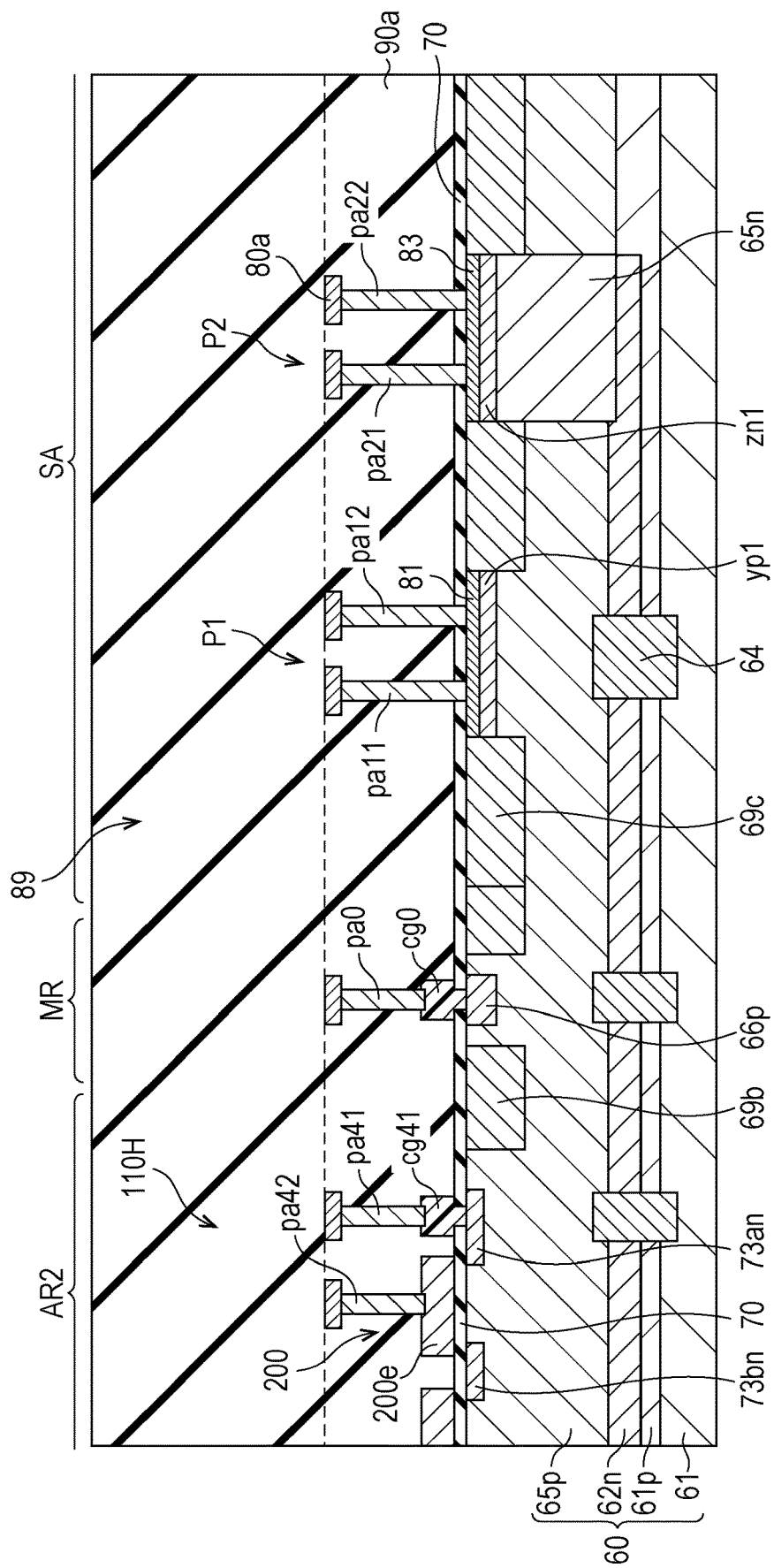
FIG. 18 is a cross-sectional view schematically illustrating one of pixels illustrated in FIG. 17.
Figure 19:
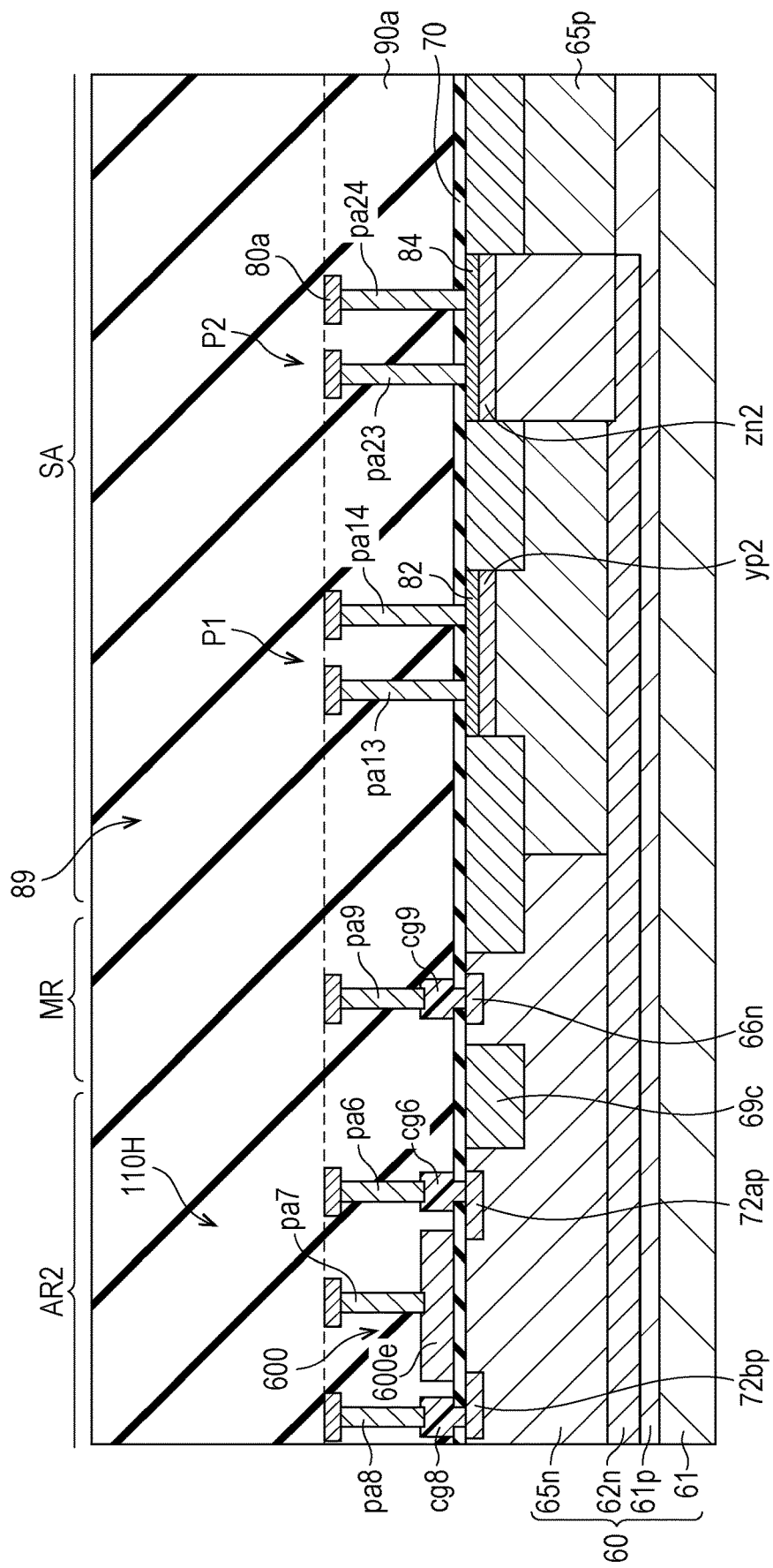
FIG. 19 is a cross-sectional view schematically illustrating another of the pixels illustrated in FIG. 17.

FIG. 17 is a schematic plan view of a pixel region PR and a surrounding area SA. FIGS. 18 and 19 are schematic cross-sectional views of the pixel region PR and the surrounding area SA.

FIG. 17 schematically illustrates the arrangement of the elements provided on the semiconductor substrate 60 when the pixel 110H illustrated in FIGS. 18 and 19 is viewed in the normal line direction of the semiconductor substrate 60. A cross section illustrated in FIG. 18 is taken along a broken line XVIII-XVIII in FIG. 17 and developed. A cross section illustrated in FIG. 19 is taken along a broken line XIX-XIX in FIG. 17 and developed.

The pixel region PR includes the pixel array AR2 and a margin region MR. The margin region MR surrounds the pixel array AR2.

The surrounding area SA surrounds the pixel region PR. Although not illustrated, a contact is electrically connected to the base substrate 61 in the surrounding area SA. The contact connects the base substrate 61 to an external circuit.

The surrounding area SA includes a first part P1 and a second part P2.

The pixel region PR and the surrounding area SA share the interlayer insulating layer 90 and the conductive structure 89. More specifically, the pixel region PR and the surrounding area SA share the wiring layer 80a. The pixel region PR and the surrounding area SA may share the wiring layer 80b, the wiring layer 80c, the wiring layer 80d, and the like.

The pixel region PR and the surrounding area SA share the base substrate 61, the p-type semiconductor region 61p, the n-type semiconductor region 62n, and the p-well 65p. The pixel region PR and the surrounding area SA each include the n-well 65n. In this example, the n-well 65n in the pixel region PR and the n-well 65n in the surrounding area SA are separate from each other.

The semiconductor substrate 60 includes diffusion regions 73an and 73bn.

The element isolation region 69c is provided between the pixel region PR and the surrounding area SA. In the surrounding area SA, the element isolation region 69c is provided between the first part P1 and the second part P2.

The pixel region PR and the surrounding area SA each include the p-type region 64. In each of the pixel region PR and the surrounding area SA, the p-type region 64 electrically connects the base substrate 61 and the p-well 65p to each other. More specifically, in each of the pixels 110H and the first part P1, the p-type region 64 electrically connects the base substrate 61 and the p-well 65p to each other.

The n-type semiconductor region 62n electrically connects the n-well 65n in the pixel region PR and the n-well 65n in the surrounding area SA to each other. More specifically, the n-type semiconductor region 62n electrically connects the n-well 65n of each of the pixels 110H and the n-well 65n in the second part P2 to each other.

In the first part P1, the conductive structure 89 includes plugs pa11, pa12, pa13, and pa14. The first part P1 includes conductive layers 81 and 82. The first part P1 includes sub-contact regions yp1 and yp2.

In the illustrated example, the plugs pa11 to pa14 are direct plugs.

The plugs pa11 to pa14 penetrate the insulating layer 70.

The plugs pa11 and pa12 are electrically connected to the conductive layer 81. The sub-contact region yp1 is provided between the conductive layer 81 and the p-well 65p.

The plugs pa13 and pa14 are electrically connected to the conductive layer 82. The sub-contact region yp2 is provided between the conductive layer 82 and the p-well 65p.

In the second part P2, the conductive structure 89 includes plugs pa21, pa22, pa23, and pa24. The second part P2 includes conductive layers 83 and 84. The second part P2 includes well contact regions zn1 and zn2.

In the illustrated example, the plugs pa21 to pa24 are direct plugs.

The plugs pa21 to pa24 penetrate the insulating layer 70.

The plugs pa21 and pa22 are electrically connected to the conductive layer 83. The well contact region zn1 is provided between the conductive layer 83 and the n-well 65n in the second part P2.

The plugs pa23 and pa24 are electrically connected to the conductive layer 84. The well contact region zn2 is provided between the conductive layer 84 and the n-well 65n in the second part P2.

In each of the pixels 110H, the conductive structure 89 includes plugs pa41, pa42, and cg41.

In the illustrated example, the plugs pa41 and pa42 are direct plugs. The plug cg41 includes a film-shaped part. The plug cg41 is a contact plug.

The plug cg41 penetrates the insulating layer 70.

The plugs pa11 to pa14, pa21 to pa24, pa41, pa42, and cg41 are provided in the insulating layer 90a.

The amplification transistor 200 includes the diffusion region 73an as either the source or the drain thereof. The amplification transistor 200 includes the diffusion region 73bn as another of the source and the drain thereof. The amplification transistor 200 includes the insulating layer 70 and the gate electrode 200e. The gate electrode 200e is provided on the insulating layer 70.

The wiring layer 80a is electrically connected to the diffusion region 73an through the plug pa41 and the plug cg41 in this order. The wiring layer 80a is electrically connected to the gate electrode 200e through the plug pa42.

Unlike in the seventh embodiment, the plugs pa0 and cg0, and the sub-contact region 66p are provided in the margin region MR. The plugs pa9 and cg9 and the well-contact region 66n are provided in the margin region MR.

The wiring layer 80a is electrically connected to the sub-contact region 66p through the plug pa0 and the plug cg0 in this order. The wiring layer 80a is electrically connected to the well-contact region 66n through the plug pa9 and the plug cg9 in this order.

The plugs (more specifically, the direct plugs) pa11 to pa14, pa21 to pa24, pa41, and pa42 are composed of a metal such as a copper or tungsten or a metal compound such as a metal nitride or a metal oxide. The same holds for the conductive layers 81 to 84.

The conductive layers 81 and 82 are electrically connected to each other as one united body and have the same potential. The same holds for the conductive layers 83 and 84.

The plug (more specifically, the contact plug) cg41 is composed of polysilicon. In the present embodiment, the plug cg41 is an n-type polysilicon plug doped with an n-type impurity. The n-type impurity is, for example, phosphorus.

The sub-contact regions yp1 and yp2 contain a p-type impurity. The well contact regions zn1 and zn2 contain an n-type impurity.

A voltage can be supplied to the p-well 65p through the wiring layer 80a, the plug pa0, the plug cg0, and the sub-contact region 66p in this order. A voltage can be supplied to the n-well 65n through the wiring layer 80a, the plug pa9, the plug cg9, and the well-contact region 66n in this order.

As illustrated in FIG. 17, a first column c1, a second column c2, a third column c3, a fourth column c4, and the like are set in the pixel region PR. In each of the columns, transistors are provided.

Each of the columns including the first to fourth columns c1 to c4 includes the sub-contact region 66p or the well-contact region 66n in the margin region MR. Each of the columns includes one continuous p-well 65p or one continuous n-well 65n extending across the margin region MR and the pixel array AR2. In each of the columns, therefore, a voltage can be stably supplied to the p-well 65p or the n-well 65n in the pixel array AR2. As a result, leak current can be suppressed in a pixel array in which transistors whose conductivity types are different from each other are provided. This is suitable for obtaining a high-quality image.

As can be seen from FIG. 17, columns including the first to fourth columns c1 to c4 share a continuous p-well 65p in the pixel array AR2. Columns share a continuous n-well 65n in the pixel array AR2. One sub-contact region 66p may be provided in the margin region MR for each of shared p-wells 65p. One well-contact region 66n may be provided in the margin region MR for each of shared n-wells 65n.

The arrangement of the elements in the plan view of FIG. 17 may be rotated by 90 degrees. In the description with reference to FIG. 17, "columns" and "rows" may be switched.

As can be seen from FIGS. 18 and 19, a voltage can be supplied to the p-well 65p through the wiring layer 80a, the plugs pa11 and pa12, the conductive layer 81, and the sub-contact region yp1 in this order. A voltage can be supplied to the p-well 65p through the wiring layer 80a, the plugs pa13 and pa14, the conductive layer 82, and the sub-contact region yp2 in this order. The supply of these voltages can stabilize the voltage of the p-well 65p.

A voltage can be supplied to the n-well 65n in the pixel region PR through the wiring layer 80a, the plugs pa21 and pa22, the conductive layer 83, the well contact region zn1, the n-well 65n in the second part P2, and the n-type semiconductor region 62n in this order. A voltage can be supplied to the n-well 65n in the pixel region PR through the wiring layer 80a, the plugs pa23 and pa24, the conductive layer 84, the well contact region zn2, the n-well 65n in the second part P2, and the n-type semiconductor region 62n in this order. The supply of these voltages can stabilize the voltage of the n-well 65n in the pixel region PR.

An example of the supply of voltages to the pixel array will be further described using terms such as "first well region" and "second well region".

In the present embodiment, the imaging device 100 includes the pixel region PR. The pixel region PR includes the pixel array AR2 and the margin region MR. The margin region MR surrounds the pixel array AR2. The pixel array AR2 includes pixels 110H arranged in a direction CD2. The pixels 110H share the p-well 65p, which is a continuous first well region. The pixels 110H share the n-well 65n, which is a continuous second well region. The margin region MR includes the sub-contact region 66p, which is a first contact region, and the well-contact region 66n, which is a second contact region. A voltage is supplied to the continuous first well region through the first contact region. A voltage is supplied to the continuous second well region through the second contact region. In doing so, a voltage can be efficiently supplied to the continuous first well region. A voltage can also be efficiently supplied to the continuous second well region.

In the present embodiment, the first well region is the p-well 65p. The second well region is the n-well 65n. The first contact region is the sub-contact region 66p. The second contact region is the well-contact region 66n.

In the present embodiment, the direction CD2 is a column direction, that is, a vertical direction or an up-and-down direction in FIG. 17. The direction CD2, however, may be a row direction, instead.

In the present embodiment, the imaging device 100 includes the surrounding area SA. The surrounding area SA surrounds the pixel region PR. The surrounding area SA and the pixel region PR share a semiconductor substrate 60. The surrounding area SA supplies a voltage to at least either the continuous first well region or the continuous second well region through an inner path of the semiconductor substrate 60.

In the plan view of FIG. 17, the gate electrode 200e of the amplifier transistor 200 is located slightly above the center of the pixel 110H. In the present embodiment, however, the gate electrode 200e of the amplifier transistor 200 may be located at the center of the pixel 110H in plan view, instead, as in FIG. 6 or the like.

Embodiment Employing Photodiode

An embodiment relating to an imaging device 100 employing the photoelectric conversion unit 17B, which is a photodiode, as the photoelectric conversion units 17 will be described hereinafter.

Figure 20:
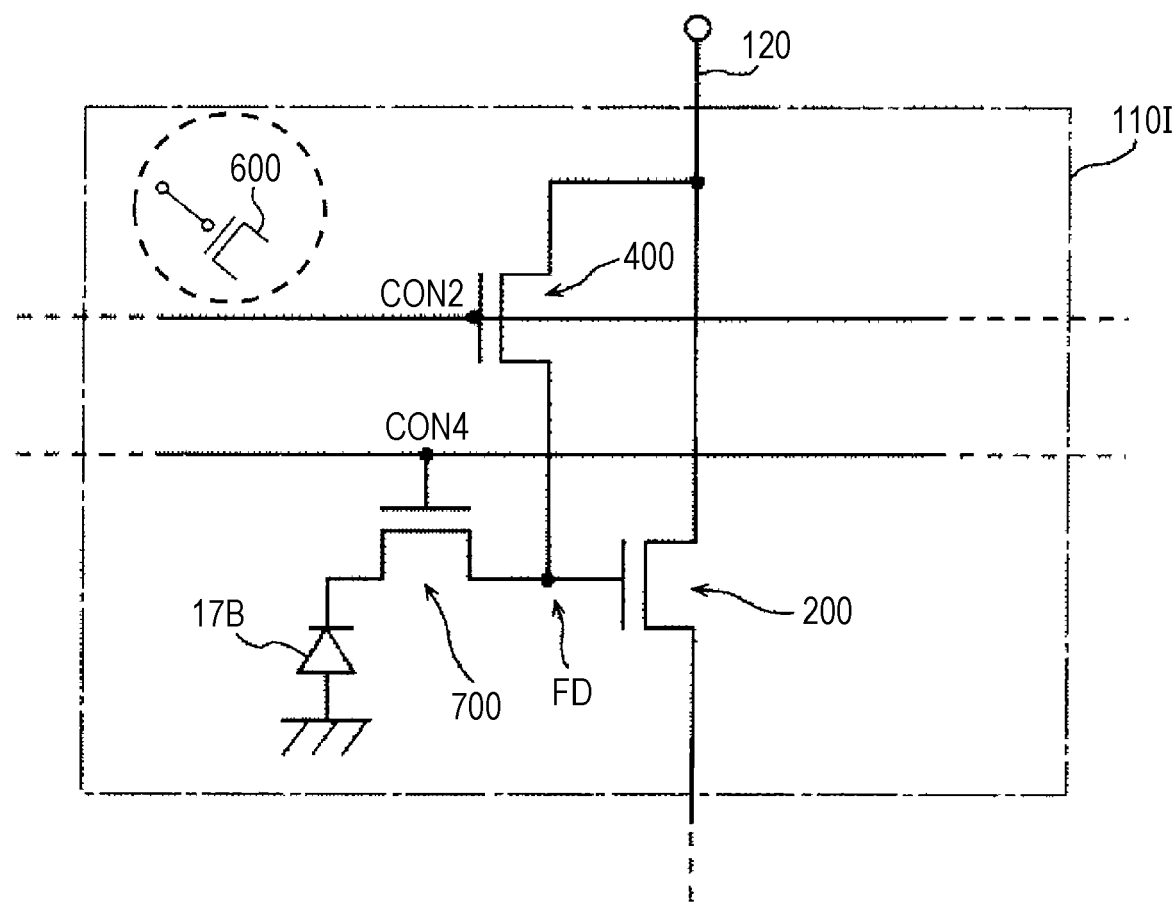
FIG. 20 is a schematic diagram illustrating the circuit configuration of a pixel according to an embodiment employing a photodiode.
Figure 21:
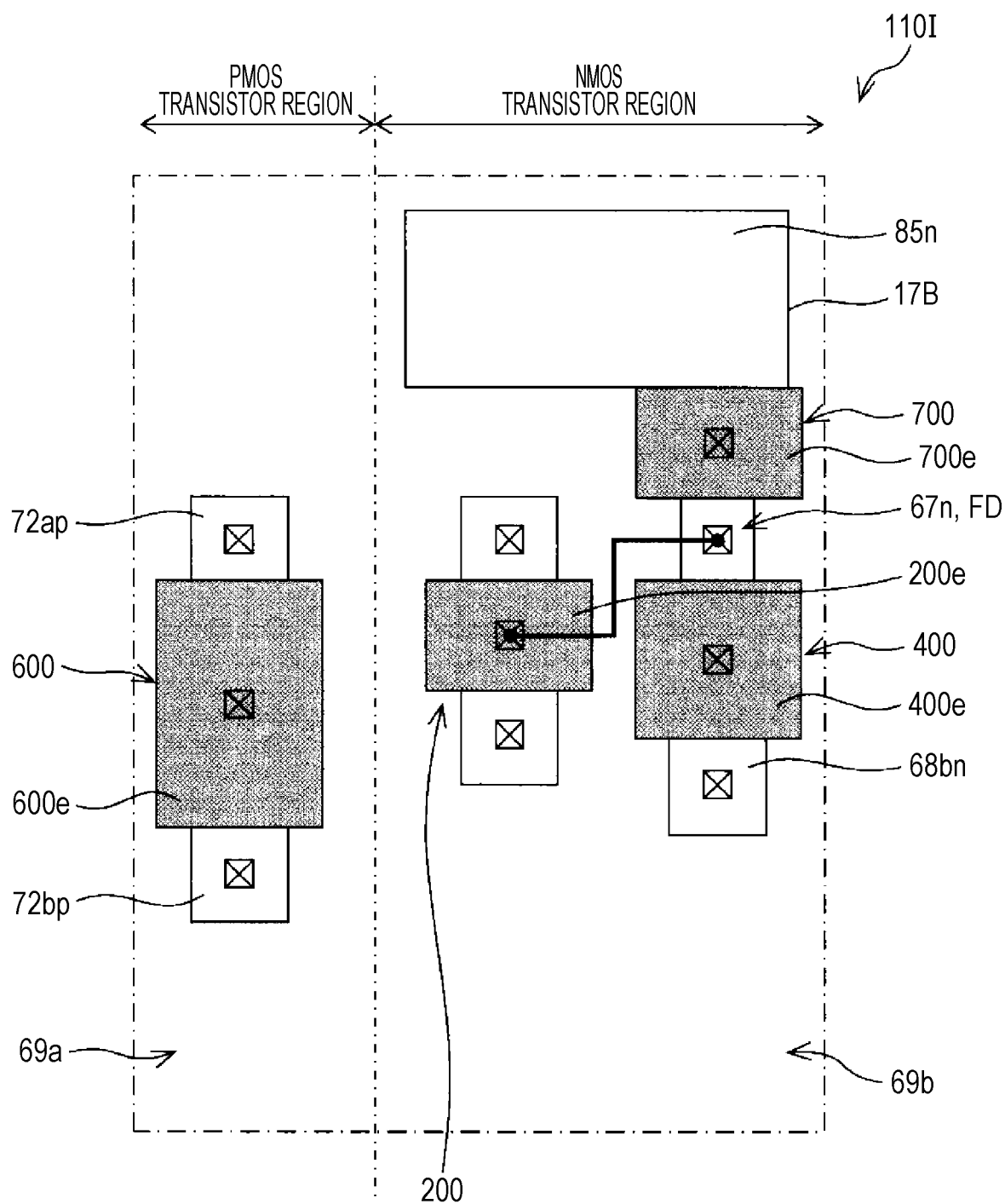
FIG. 21 is a schematic plan view illustrating an example of a layout of elements in the pixel according to the embodiment employing a photodiode.

FIG. 20 illustrates the circuit configuration of a pixel 110I in the imaging device 100 according to the present embodiment. FIG. 21 is a plan view of the pixel 110I.

The pixel 110I includes a photodiode and a transfer transistor 700.

The photodiode includes an n-type impurity region 85n and a pinning layer.

The pinning layer is located above the n-type impurity region 85n. The pinning layer is a p-type impurity region. FIGS. 20 and 21 do not illustrate the pinning layer.

The photodiode generates charge by performing photoelectric conversion on light received during a predetermined exposure period. After an end of the predetermined exposure period, a transfer signal is applied to a gate of the transfer transistor 700 through a transfer control signal line CON4. As a result, the transfer transistor 700 is turned on, and the charge generated by the photodiode is transferred to the charge accumulation unit FD.

The amplifier transistor 200 outputs, to the signal reading line 7, a signal according to the charge transferred to the charge accumulation unit FD. The output signal can be subjected to signal processing such as A/D conversion.

The transfer transistor 700 includes the diffusion region 67n, which is the first diffusion region, as either a source or a drain thereof. The transfer transistor 700 includes the n-type impurity region 85n as another of the source and the drain. The transfer transistor 700 includes the gate electrode 700e. The transfer transistor 700 shares the diffusion region 67n with the reset transistor 400 as either the source or the drain thereof. As described above, the diffusion region 67n corresponds to the charge accumulation unit FD.

Either the source or the drain of the reset transistor 400, the gate electrode 200e of the amplifier transistor 200, and either the source or the drain of the transfer transistor 700 are electrically connected to one another.

According to the embodiments of the present disclosure, an imaging device capable of suppressing an effect of leak current and performing high-quality imaging is provided. The imaging device in the present disclosure is effective in, for example, image sensors, digital cameras, and the like. The imaging device in the present disclosure can be used in medical cameras, robot cameras, security cameras, cameras used on vehicles, and the like.

What is claimed is:
1. An imaging device comprising:
   a semiconductor substrate; and
   a plurality of pixels disposed on a main surface of the semiconductor substrate, wherein:
   each of the plurality of pixels includes:
   a charge accumulator that is formed on the substrate and accumulates charge generated through photoelectric conversion and that contains an impurity of a first conductivity type;
   a first transistor that is formed on the substrate and includes a first gate electrode and a first diffusion region containing an impurity of the first conductivity type, the first gate electrode being electrically connected to the charge accumulator, the first diffusion region functioning as a source or a drain;
   a second transistor that is formed on the substrate and includes a second gate electrode and a second diffusion region containing an impurity of a second conductivity type different from the first conductivity type, the second diffusion region functioning as a source or a drain;
   a first well region that contains an impurity of the second conductivity type; and
   a second well region that contains an impurity of the first conductivity type,
   in a plan view, which is a view from a normal direction of the main surface of the substrate, the first transistor and the charge accumulator are located in the first well region and the second transistor is located in the second well region, and
   in the plan view, a distance between the charge accumulator and the second transistor is larger than a distance between the charge accumulator and the first transistor.

2. The imaging device according to claim 1, wherein:
   each of the plurality of pixels further includes an element isolation region that is formed on the substrate and isolates the charge accumulator, the first transistor and the second transistor, and
   in the plan view, a distance between the charge accumulator and a part of the element isolation region surrounding the second transistor is larger than the distance between the charge accumulator and the first transistor.

3. The imaging device according to claim 1,
wherein the first transistor is an amplifier transistor that generates a signal according to the charge accumulated in the charge accumulator.

4. The imaging device according to claim 1,
wherein, in the plan view, the first transistor is located in a central region of each of the plurality of pixels.

5. The imaging device according to claim 1,
wherein, in the plan view, the first transistor is disposed between the charge accumulator and the second transistor in a first direction.

6. The imaging device according to claim 1, wherein the first conductivity type is an n-type, and the second conductivity type is a p-type.

7. The imaging device according to claim 1,
wherein, in the plan view, an area of the first well region is larger than an area of the second well region.

8. The imaging device according to claim 1, wherein:
   the plurality of pixels include a first pixel and a second pixel located adjacent to the first pixel, and
   in the plan view, the second transistor of the first pixel and the second transistor of the second pixel are disposed between the charge accumulator of the first pixel and the charge accumulator of the second pixel in a first direction.

9. The imaging device according to claim 7, wherein:
   the plurality of pixels include a first pixel and a second pixel located adjacent to the first pixel, and the first pixel and the second pixel share the first well region.

10. The imaging device according to claim 1, wherein; each of the plurality of pixels further includes:
   a photoelectric conversion layer that converts light into the charge; and
   a pixel electrode that collects the charge generated in the photoelectric conversion layer, and
the charge accumulator accumulates the charge collected by the pixel electrode.

11. The imaging device according to claim 10, wherein each of the plurality of pixels further includes a conductive structure that connects the pixel electrode and the charge accumulator to each other.

12. The imaging device according to claim 1, wherein each of the plurality of pixels further includes a photodiode that converts light into the charge.

13. The imaging device according to claim 1, wherein the first diffusion region of the first transistor and the second diffusion region of the second transistor are seen in a cross section perpendicular to the main surface of the semiconductor substrate.

14. The imaging device according to claim 1, wherein the first diffusion region of the first transistor is different from the charge accumulator.

15. The imaging device according to claim 1, wherein, in the plan view, a distance between the charge accumulator and the second gate electrode of the second transistor is larger than a distance between the charge accumulator and the first gate electrode of the first transistor.

16. An imaging device comprising:
a semiconductor substrate; and
a pixel disposed on a main surface of the semiconductor substrate, wherein:
the pixel includes:
   a first transistor that is formed on the substrate and includes a first diffusion region and a first gate electrode, the first diffusion region being a source or a drain, the first gate electrode containing an impurity of a first conductivity type;
   a second transistor that is formed on the substrate and includes a second diffusion region and a second gate electrode, the second diffusion region being a source or a drain, the second gate electrode containing an impurity of a second conductivity type different from the first conductivity type;
   a first contact plug that is connected to the first diffusion region and that contains an impurity of the first conductivity type;
   a second contact plug that is connected to the second diffusion region and that contains an impurity of the second conductivity type;
   a first well region that contains an impurity of the second conductivity type; and
   a second well region that contains an impurity of the first conductivity type, and
in a plan view, which is a view from a normal direction of the main surface of the substrate, the first transistor is located in the first well region and the second transistor is located in the second well region.

17. The imaging device according to claim 16, wherein the first diffusion region contains an impurity of the first conductivity type, and
the second diffusion region contains an impurity of the second conductivity type.

18. The imaging device according to claim 16, wherein the first diffusion region is a charge accumulator that accumulates charge generated through photoelectric conversion, and
the first transistor is a reset transistor that resets potential of the first diffusion region.

19. The imaging device according to claim 16, wherein the first diffusion region is a charge accumulator that accumulates charge generated through photoelectric conversion, and
the first gate electrode is electrically connected to the first diffusion region.

* * * * *